United States Patent
Osumi et al.

(10) Patent No.: US 6,578,989 B2
(45) Date of Patent: Jun. 17, 2003

(54) OPTICAL DEVICE FOR AN OPTICAL ELEMENT AND APPARATUS EMPLOYING THE DEVICE

(75) Inventors: Yoshimasa Osumi, Kyoto (JP); Akira Matsui, Kyoto (JP); Hironobu Kiyomoto, Kyoto (JP)

(73) Assignee: Omron Corporation, Kyoto (JP)

( * ) Notice: Subject to any disclaimer, the term of this patent is extended or adjusted under 35 U.S.C. 154(b) by 97 days.

(21) Appl. No.: 09/967,846

(22) Filed: Sep. 28, 2001

(65) Prior Publication Data

US 2002/0057571 A1 May 16, 2002

(30) Foreign Application Priority Data

Sep. 29, 2000 (JP) .......................................... 2000-300429
May 24, 2001 (JP) .......................................... 2001-155999

(51) Int. Cl.$^7$ .............................................. F21V 7/100
(52) U.S. Cl. ...................... 362/298; 362/800; 362/300; 362/310; 257/98; 313/512
(58) Field of Search ................................ 362/298, 299, 362/300, 800, 310, 311, 240, 545, 241; 359/248; 257/98, 100, 99; 313/512

(56) References Cited

U.S. PATENT DOCUMENTS

| | | | | |
|---|---|---|---|---|
| 4,755,916 A | * | 7/1988 | Collins | ........................ 362/236 |
| 4,975,814 A | * | 12/1990 | Schairer | ...................... 362/240 |
| 5,177,593 A | * | 1/1993 | Abe | ............................. 257/98 |
| 6,404,131 B1 | * | 6/2002 | Kawano et al. | ................ 315/82 |
| 6,448,583 B1 | * | 9/2002 | Yoneda et al. | ................. 257/81 |

\* cited by examiner

*Primary Examiner*—Sandra O'Shea
*Assistant Examiner*—Ali Alavi
(74) *Attorney, Agent, or Firm*—Rosenthal & Osha L.L.P.

(57) ABSTRACT

An optical device for an optical element to control a light path about emission light emitted from the optical element to external or incident light entered from external to the optical element, which includes a light reflecting member, a resin member covering a light reflection surface of the light reflecting member, and a bumper member interposed between the light reflecting member and the resin member. The resin member is provided with a boundary surface for almost totally reflecting light deviated from a predetermined region in front of the optical element, and the boundary surface of the resin member or the light reflecting member is so disposed that light deviating from the predetermined region in front of the optical element and passing between the optical element and an external of the optical device is reflected more than once with each of the boundary surface and the light reflecting member.

21 Claims, 19 Drawing Sheets

(A) (B)

(A) (B)

(A)

(B)

(a)

(b)

(c)

OPTICAL DEVICE FOR AN OPTICAL ELEMENT AND APPARATUS EMPLOYING THE DEVICE

BACKGROUND OF THE INVENTION

This invention relates generally to the field of optical devices and in particular, relates to an improved optical device including a transparent mold resin and a light reflecting member.

Light emitting apparatuses in which a light emitting element chip such as a light emitting diode is sealed by a mold resin are well known in the art. Light emitted from the light emitting element chip to its front is emitted as it is from the light emitting apparatus, but the light emitted in a diagonal direction from the light emitting element chip is totally reflected by a boundary surface of the mold resin or scattered by an inner wall of a housing, thus resulting in decreased light, thereby deteriorating the efficiency of light use.

Accordingly, as shown in FIG. 26, there has been heretofore proposed a light emitting apparatus having a good efficiency for outwardly emitting the light emitted from a light emitting element in a diagonal direction.

The conventional light emitting element of FIG. 26 includes a light emitting element chip 101, a transparence glass substrate 102, lead frames 103 and 104, a bonding wire 105, a light reflecting member 106, and a mold resin 108 made of an optically transparent resin. Lead frames 103 and 104 are disposed on a rear wall of the transparent glass substrate 102, and the light emitting element chip 101 is mounted on a rear surface of the lead frame 103 to be connected with the lead frame 104 by the bonding wire 105. A reflection surface 107 of the light reflecting member 106 is formed polyhedron by plural flat domains.

In this conventional light emitting apparatus, light is emitted backside from the light emitting element chip 101 to be reflected by the reflection surface 107 and emitted forward through the resin mold 108 and the transparent glass substrate 102. In particular, light emitted from the light emitting element chip 101 in a diagonal direction is reflected back by the reflection surface 107 to be emitted forward through the resin mold 108 and the transparent glass substrate 102, thereby improving the light use efficiency. When a light receiving element chip such as a photodiode is employed instead of the light emitting element chip 101 to receive incident light, a light receiving module having a good efficiency is provided.

The conventional light emitting apparatus, however, has the disadvantages that light reflected by the light reflecting member is obstructed by the light emitting element chip and the lead frame when it is emitted forward, thereby producing shadows of these components and deteriorating the advantage of utilization of light near the optical axis center where quantity of light should be provided most well.

Furthermore, because of darkness near the optical axis center in the directional pattern of light emitted by the light emitting apparatus, its appearance is bad as a light source for display, and malfunction of visual sense is produced.

In addition, when the light emitting apparatus is used at an intense place of temperature change, stresses are concentrated near a boundary surface of the light reflecting member and the mold resin because of a difference of coefficients of thermal expansion of the light reflecting member and the mold resin, thereby causing cracks in the mold resin.

SUMMARY OF INVENTION

It is, therefore, a primary object of this invention to provide an optical device having a predetermined directional pattern and a structure for preventing cracks, which is designed to be coupled with a light emitting element, such as a light emitting element chip or a light emitting element module sealing the light emitting element chip in a mold resin, or a light receiving element, such as a light receiving element chip or a light receiving element module sealing the light receiving element chip in a mold resin, by sealing or assembling the same.

It is a further object of this invention to provide an optical device including a mold resin and a light reflecting member sealed by the mold resin to be coupled with an optical element of a light emitting element or a light receiving element.

It is still further object of this invention to provide an optical apparatus including a plurality of optical devices each having a mold resin and a light reflecting member sealed by the mold resin to be coupled with an optical element of a light emitting element or a light receiving element.

According to another aspect of this invention, there is provided an optical device for an optical element to control a light path about emission light emitted from the optical element to external or incident light entered from external to the optical element, which includes a light reflecting member, a resin member covering at least a light reflection surface of the light reflecting member, and a bumper member interposed between the light reflecting member and the resin member, the resin member including a boundary surface for almost totally reflecting light deviated from a predetermined region in front of the optical element, the boundary surface of the resin member or the light reflecting member being so disposed that light deviating from the predetermined region in front of the optical element and passing between the optical element and an external of the optical device is reflected more than once with each of the boundary surface and the light reflecting member. The resin member may further include a lens portion for emitting or collecting light reaching the predetermined region in front of the optical element.

The bumper member may be disposed on a concentrated portion of stresses produced by the thermal expansion or shrinkage of the light reflecting member and the resin member.

Optical devices constructed in accordance with the present invention may have an improved efficiency of light use, and prevent production of any cracks by the bumper member for absorbing stresses produced by a difference of thermal expansion coefficients of the light reflecting member and the mold resin, thereby resolving the malfunctions that a crack is produced to hinder light emitted from the optical element or entered into the same, and the light reflecting member and the optical element are rusted or deteriorated by steam or gas to deteriorate the reliability.

The bumper member may have a soft layer having low degree hardness, a gas layer, a fluid layer or a cavity layer produced by shrinkage. The bumper member is desired to have a hardness of 50 or less prescribed with the Japanese Industrial Standard JISK6249.

Thus designed bumper member may ensure dissipation of a stress produced by a difference of thermal expansion coefficients of the light reflecting member and the mold resin.

Preferably, the bumper member may be configured to have a uniform or almost uniform thickness, namely, substantially uniform thickness. The thickness of the bumper member is desired to be 100 μm or less, more preferably not less than 30 μm or more than 100 μm.

Thus designed bumper member may minimize the deviation of an emission direction of light which is caused by a difference of refractive indexes of the mold resin and the bumper member, and optimize the center efficiency and the directive angle, thereby providing an optical device capable of affording variations in assembling.

A plurality of the above-mentioned optical devices may be arranged to provide an optical device array for optical elements for application to a light emission device of a thin and large scale type or a light receiving apparatus of a thin and large scale type which efficiently receives light entering into a front wall of the apparatus.

As the above-mentioned optical device array is coupled with optical elements, there may be provided an optical apparatus in which the optical elements are so disposed that light deviating from the predetermined region in front of each of the optical elements and passing between each of the optical element and an external of each of the optical device is reflected more than once with each of the boundary surface and the light reflecting member.

According to this optical apparatus, there may be provided a light emitting apparatus of a thin and large scale type by employing light emitting elements composed of light emitting element chips or light emitting element modules in which the light emitting element chips are sealed by mold resins as the optical elements, or a light receiving apparatus of a thin and large scale type to receive light entering into a front wall of the apparatus with good efficiency by employing light receiving elements composed of light elements chips or light receiving element modules in which the light receiving element chips are sealed by mold resins as the optical elements.

According to another aspect of this invention, there is provided an optical apparatus including an optical element and an optical device for the optical element to control a light path about emission light emitted from the optical element to an external or incident light entered from an external to the optical element, the optical device including a light reflecting member, a resin member covering a light reflection surface of the light reflecting member, and a bumper member interposed between the light reflecting member and the resin member, in which the resin member includes a boundary surface for almost totally reflecting light deviated from a predetermined region in front of the optical element, and the boundary surface of the resin member or the light reflecting member is so disposed that light deviating from the predetermined region in front of the optical element and passing between the optical element and an external of the optical device is reflected more than once with each of the boundary surface and the light reflecting member.

The optical element of the optical apparatus may be a light emitting element composed of a light emitting element chip or a light emitting element module in which the light emitting element chip is sealed by a mold resin. Thus constructed optical apparatus may provide a light emitting apparatus having good efficiency of light use and a protective function for preventing production of cracks caused by a difference of thermal expansion coefficients of the light reflecting member and the mold resin member.

The boundary surface of the resin member may be designed to include a region where a total reflection point of the boundary surface for totally reflecting first light emitted from the light emitting element has the same location as that of a passing point of the boundary surface passed by second light which is emitted from the light emitting element and totally reflected on a point of the boundary surface closer to the light emitting element than the total reflection point to be reflected by the light reflecting member for emission to an external of the apparatus.

Thus designed boundary surface of the resin member may omit any other light reflecting member near the boundary surface and avoid any interruption against light emission by other light reflecting member, thereby improving the efficiency of light use with a simplified construction.

This optical apparatus employing the light emitting element as the optical element may be modified to provide a light emitting apparatus which includes a plurality of light emitting elements composed of light emitting element chips or light emitting element modules in which the light emitting element chips are sealed by a resin mold, and a plurality of optical devices controlling light paths about emission light emitted from the light emitting elements to externals. The optical devices each includes a light reflecting member, a resin member covering a light reflection surface of the light reflecting member, and a bumper member interposed between the light reflecting member and the resin member, in which the resin member includes a boundary surface for almost totally reflecting light deviated from a predetermined region in front of the light emitting element, and the boundary surface of the resin member or the light reflecting member is so disposed that light deviating from the predetermined region in front of the light emitting element and passing from the light emitting element to an external of the optical device is reflected more than once with each of the boundary surface and the light reflecting member.

A display component employing this light emitting apparatus may prevent development of cracks in the outdoors where a difference of heat and cold is intense, thereby providing a high luminous efficiency and a high reliability.

In addition, a lamp light source consisting of this light emitting apparatus for an automobile can hold a high luminous efficiency and a high reliability in a severe temperature circumstances. An outdoor display instrument employing the light emitting apparatus such as a traffic signal also can hold a high luminous efficiency and a high reliability in the outdoors where difference of heat and cold is intense, thereby improving its visual recognition and reducing frequency of its maintenance.

The optical element of the above-mentioned optical apparatus also may be a light receiving element that is a light receiving element chip or a light receiving element module in which the light receiving element chip is sealed by a mold resin.

Thus constructed optical apparatus may provide a light receiving apparatus having good efficiency of light use and a protective function for preventing production of cracks caused by a difference of thermal expansion coefficients of the light reflecting member and the mold resin member.

The light receiving apparatus may be designed to employ a boundary surface in the resin member which provides a first light path where first external light entering through the boundary surface of the resin member to be reflected by the light reflecting member is totally reflected on a total reflection point of the boundary surface to enter into the light receiving element, and a second light path where second external light entering through the total reflection point of the boundary surface to be reflected by the light reflecting member is totally reflected on a point of the boundary surface closer to the light receiving element than the total reflection point to enter into the light receiving element.

Thus designed boundary surface of the resin member may omit any other light reflecting member near the boundary surface and avoid any interruption against light entry by other light reflecting member, thereby improving the efficiency of light use with a simplified construction.

The optical element of the optical apparatus may be disposed near a mirror image position of a focal point of the light reflecting member over the boundary surface of the resin member. This optical apparatus is useful for a light emitting apparatus for emitting almost paralleled light or a light receiving apparatus for receiving almost parallel light.

According to another aspect of this invention, there is provided a method for manufacturing an optical device for an optical element to control a light path about emission light emitted from the optical element to an external or incident light entered from an external to the optical element, which includes the steps of putting a bumper member on a light reflecting member, and covering the light reflecting member with a resin member so that light deviating from a predetermined region in front of the optical element and passing between the optical element and an external of the optical device is reflected more than once with each of the boundary surface and the light reflecting member.

According to this manufacturing method, the location concern of the boundary surface of the resin member and the light reflecting member may be defined in a location concern for improving the efficiency of light use, and the bumper member may be easily disposed between the resin member and the light reflecting member.

This method may be modified to include an optical element. According to this modified method, there is provided a method for manufacturing an optical apparatus including the optical element within the apparatus to control a light path about emission light emitted from the optical element to an external or incident light entered from an external to the optical element, which includes the steps of putting a bumper member on a light reflecting member, and covering the optical element and the light reflection with a resin member so that light deviating from a predetermined region in front of the optical element and passing between the optical element and an external of the optical apparatus is reflected more than once with each of the boundary surface and the light reflecting member.

According to this modified manufacturing method, the location concern of the boundary surface of the optical element, the resin member and the light reflecting member may be defined in a location concern for improving the efficiency of light use, and the bumper member may be easily disposed between the resin member and the light reflecting member.

According to another aspect of this invention, there is provided a method for controlling a light path about emission light emitted from an optical element to an external or incident light entered from an external to the optical element in an optical apparatus including a light reflecting member and a resin member covering the light reflecting member provided with a boundary surface, which includes the steps of directing light deviating from a predetermined region in front of the optical element and passing between the optical element and an external of the optical apparatus to be reflected more than once with each of the boundary surface and a light reflecting member, and directing light reflected by the light reflecting member to pass through a bumper member disposed on at least a portion of the light reflecting member.

According to this control method, even when the bumper member for preventing production of cracks in the mold resin member is disposed, a desired directional pattern can be obtained by the location concern of the optical element, the boundary surface of the resin member and the light reflecting member, and the arrangement concern, materials and thickness of the bumper member.

Other aspects and advantages of the invention will be apparent from the following description and the appended claims.

DETAILED DESCRIPTION

Figure 1:
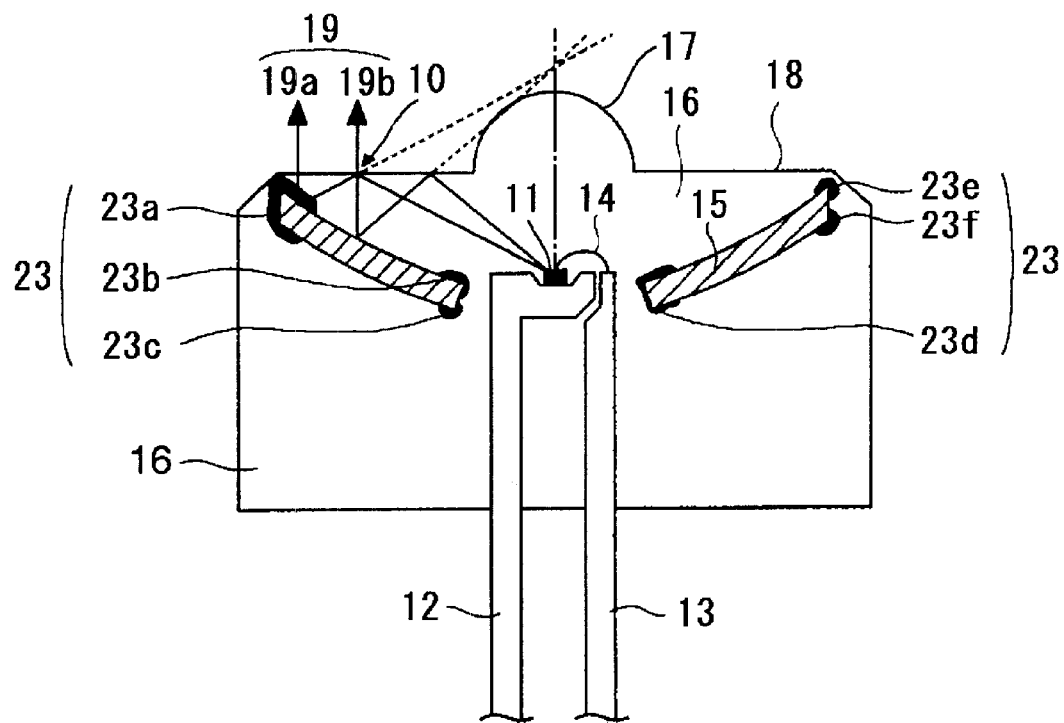
FIG. 1 shows a schematic sectional side view showing a major constitution of a light emission device according to one embodiment of the present invention.

Referring, now, to FIG. 1, there is shown a schematic view of a light emitting apparatus or light emission device (an optical apparatus) as a first embodiment of this invention. This light emission device includes a light emitting element chip 11 such as a light emitting diode (LED), a semiconductor laser (LD) or the like, a lead frame 12 on a saucer portion of which the light emitting element chip 11 is die bonded, and another lead frame 13 connected with the light emitting element chip by a bonding wire 14. There are further disposed a light reflecting member 15 around the lead frames 12 and 13, and a mold resin 16 sealing these members. While reference is made in the following embodiments to a mold resin 16, it is apparent to one of ordinarily skill in the art that other resins may be used are expressly within the scope of the present invention as "resin members," as used herein.

In the light emission device, a direct emission region 17 forming a convex lens having a spherical lens-shape, an a spherical lens shape, or paraboloid shape is disposed at a center of a light emission side of the mold resin 16, and the light emitting element chip 11 is located in a focal point of the direct emission region 17 or its neighborhood. Accordingly, light emitted from the light emitting element chip 11 and directed to the direct emission region 17 is forwardly emitted approximately in parallel from a front wall of the mold resin 16.

A planar total reflection region 18 is formed around the direct emission region 17 to surround the same. The angle viewed from the element chip 11 which is made by an optical axis of the light emitting element chip 11 and a direction to a border between regions 17 and 18 is designed to be equal to or greater than the critical angle of total reflection between mold resin 16 and air. Therefore, in the light emitted from the light emitting element chip 11, light directed to the total reflection region 18 is totally reflected with boundary surface of mold resin 16, and further reflected by the light reflecting member 15 to be emitted forwardly from the total reflection region 18 as shown by arrow-marked light paths 19. The total reflection region, therefore, may also be considered as having total internal reflection, as that term is defined in physics.

In order to emit approximately parallel light as indicated in the light paths 19a and 19b, the light emitting element chip 11 is disposed in a focal point of the light reflecting member 15. In other words, since light in the light emission device of FIG. 1 is totally reflected by a is boundary surface of the mold resin 16 as shown by the paths 19a and 19b, the light emitting element chip 11 may be disposed at a mirror image location of the focal point location with respect to the boundary surface of the mold resin 16.

As shown by light paths 19a and 19b crossing the total reflection region 18, the region 18 on the boundary surface of the resin member includes a region 10 where a total reflection point of the boundary surface for totally reflecting first light (path 19a) emitted from the light emitting element chip 11 has the same location as that of a passing point of the boundary surface passed by second light (path 19b) which is emitted from the light emitting element chip 11 and totally reflected on a point of the boundary surface closer to the light emitting element chip 11 than the above-mentioned total reflection point to be reflected by the light reflecting member 15 for emission to external of the light emission device. Since the total reflection of the boundary surface of the mold resin 16 is utilized, another light reflecting member is not necessary to be disposed on the boundary surface of the mold resin 16, and interruption of light by such another reflection member may be prevented.

Therefore, in the light emission device of this embodiment, most of the light emitted by the light emitting element chip 11 is emitted from direct emission region 17 and total reflection region 18 as significance light, thereby providing the light emission device having good efficiency.

In comparison with the case where an aluminum evaporation film is employed as the light reflecting member 15, this light emission device employing a metal member of a curved plate as the light reflecting member may provide an easily assembled construction at a greatly reduced cost, and prevent the accident where a crack appears in the evaporation film when coefficients of thermal expansion are different between the resin mold and the evaporation film.

Though the light emitting element chip 11 is disposed at a center of the light reflecting member 15 in this embodiment, it may be replaced with a light receiving element chip (11) such as a photo diode, a solar battery or the like to receive external light entering from the front, thereby providing a light receiving device (optical apparatus shown in FIG. 1). The light receiving device includes a total reflection region 18 providing a light path 19a (reversal of the arrow-marked light path in FIG. 1) where first external light entering through the boundary surface of the resin member 16 to be reflected by the light reflecting member 15 is totally reflected on a total reflection point (location indicated by reference mark 10 of FIG. 1) of the boundary surface to enter into the light receiving element chip 11, and a light path 19b (reversal of the arrow-marked light path in FIG. 1) where second external light entering through the above-mentioned total reflection point (location indicated by reference mark 10 of FIG. 1) of the boundary surface to be reflected by the light reflecting member 15 is totally reflected on a point of the boundary surface closer to the light receiving element chip 11 than the above-mentioned total reflection point to enter into the light receiving element chip 11.

This alternation where the light emitting element chip is replaced with a light receiving element chip may be applied to the following embodiments described hereinafter.

The light emission device of FIG. 1 is further provided with a crack prevention structure. In the optical device composed of the light reflecting member 15 and the mold resin 16, there are inserted bumper members 23 (23a to 23f) made of materials having a good transmission about light emitted from the light emitting element chip 11 and smaller hardness than that of the mold resin 16 when the respective members of the light emission device are sealed by the mold resin 16. The bumper members 23 are disposed at the locations 23a to 23f of the light reflecting member 15 where stresses are concentrated by a difference of thermal expansion coefficients of the light reflecting member 15 and the mold resin 16, namely, stresses by the light reflecting member 15, thereby dissipating any stresses produced by the difference of thermal expansion coefficients of light reflecting member 15 and mold resin 16.

Figure 2:
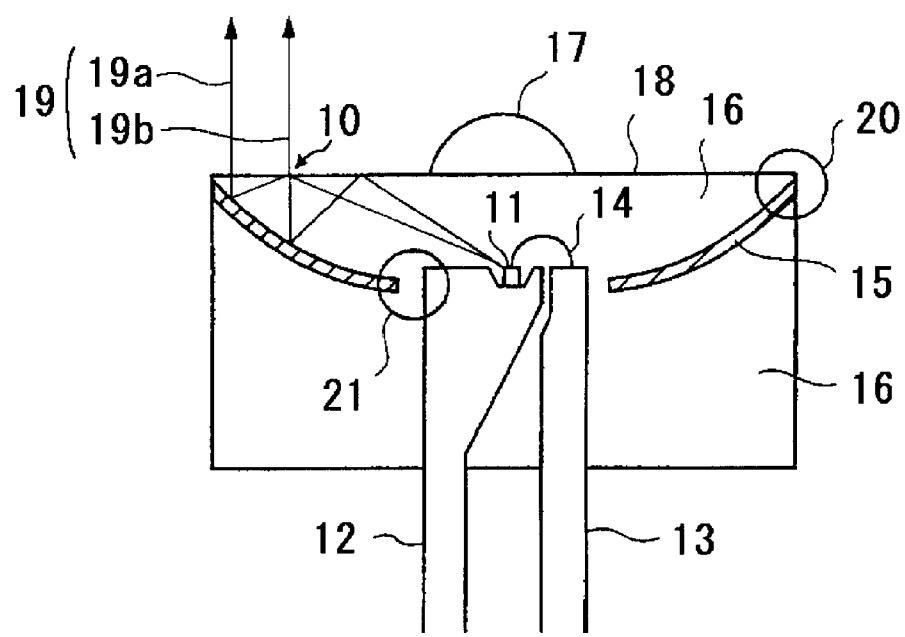
FIG. 2 shows a schematic sectional side view of a light emission device to explain a portion where a crack is produced in a mold resin of the device.

In FIG. 2, there is shown a light emission device employing an optical device not provided with such crack prevention structure in order to explain the locations where cracks are produced in the mold resin 16 of the optical device according to this invention. The light emission device of FIG. 2 includes light emitting element chip 11 such as a light emitting diode (LED), a semiconductor laser (LD) or the like, lead frame 12 on a saucer portion of which light emitting element chip 11 is die bonded, another lead frame 13 connected with the light emitting element chip by bonding wire 14, light reflecting member 15 around the lead frames 12 and 13, and mold resin 16 sealing these members.

In the light emission device, a direct emission region 17 forming a convex lens having a spherical lens-shape, an aspherical lens shape, or paraboloid shape is disposed at a center of a light emission side of the mold resin 16, and the light emitting element chip 11 is located in a focal point of the direct emission region 17 or its neighborhood. Accordingly, the light emitted from light emitting element chip 11 and directed to emission region 17 is forwardly emitted approximately in parallel from a front wall of the mold resin 16.

A planar total reflection region 18 is formed around the direct emission region to surround the region 17. The angle viewed from the element chip 11 which is made by an optical axis of the light emitting element chip 11 and a direction to a border between regions 17 and 18 is designed to be equal to the critical angle of total reflection between mold resin 16 and air, or larger. Therefore, as shown by light paths 19a and 19b, the light directed to total reflection region 18 in the light emitted from light emitting element chip 11 is totally reflected with boundary surface of mold resin 16, and further reflected by the light reflecting member 15 to be emitted forwardly from the total reflection region 18 as shown by arrow-marked light paths.

As shown by light paths 19a and 19b crossing total reflection region 18, the region 18 on the boundary surface of the resin member includes a region 10 where a total reflection point of the boundary surface for totally reflecting first light (path 19a) emitted from the light emitting element chip 11 has the same location as that of a passing point of the boundary surface passed by second light (path 19b) which is emitted from the light emitting element chip 11 and totally reflected on a point of the boundary surface closer to the light emitting element chip 11 than the above-mentioned total reflection point to be reflected by the light reflecting member 15 for emission to an external of the apparatus.

Since the total reflection of the boundary surface of mold resin 16 is utilized, another light reflecting member is not necessary to be disposed on the boundary surface of mold resin 16, and interruption of light by such another reflection member may be prevented.

Therefore, in the light emission device of FIG. 2, most of the light emitted by the light emitting element chip 11 is emitted from the direct emission region 17 and the total reflection region 18 as significance light, thereby providing the light emission device having good efficiency.

Though the light emitting element chip 11 is disposed at a center of the light reflecting member 15 in this device of FIG. 2, it may be replaced with a light receiving element chip (11) such as a photo diode, a solar battery or the like to receive external light entering from the front, thereby providing a light receiving device.

In this light emission device having the light reflecting member 15 and the mold resin 16, the layer of the mold resin 16 becomes thinner as it approaches its edge portion. Accordingly, a thinned portion is produced in mold resin 16 by an acute angle department of light reflecting member 15 at the most circumference portion 20 of the member 15 shown in FIG. 2. Moreover, other thinned portions are produced at the reflection member 15 near the lead frame 12 as shown by a circled mark 21, and near the lead frame 13. The coefficient of thermal expansion in a temperature change is 11–15 ppm about metals, but 70–100 ppm about resins that is greatly different from that about metals, whereby direction of stress in expansion and shrinkage about metals is greatly different from that about resins.

When temperature changes on molding the mold resin 16, or the light emission device is used at the place where temperature change is large in an operating environment such as in a car where the temperature change is intense, the light reflecting member 15 employing metals causes the problem in which a crack is liable to occur in the mold resin 16 near light reflecting member 15 because stresses are concentrated on the thinned portions 20 and 21 of mold resin 16 by the difference of the coefficients of thermal expansion of the metals and resins and there exists an acute angle portion in the light reflecting member 15 at portion 21.

Figure 3:
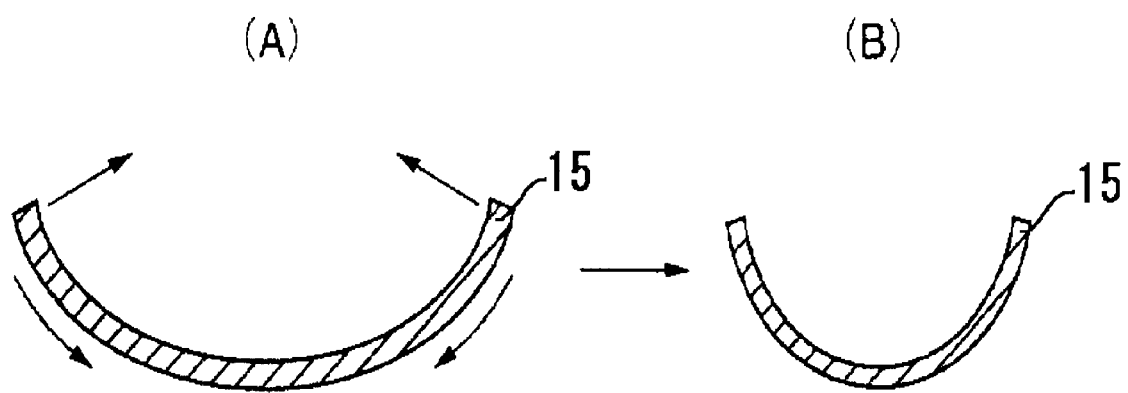
FIG. 3 shows a sectional side view of a light reflecting member to explain an effect by thermal shrinkage of the light reflecting member.
Figure 4:
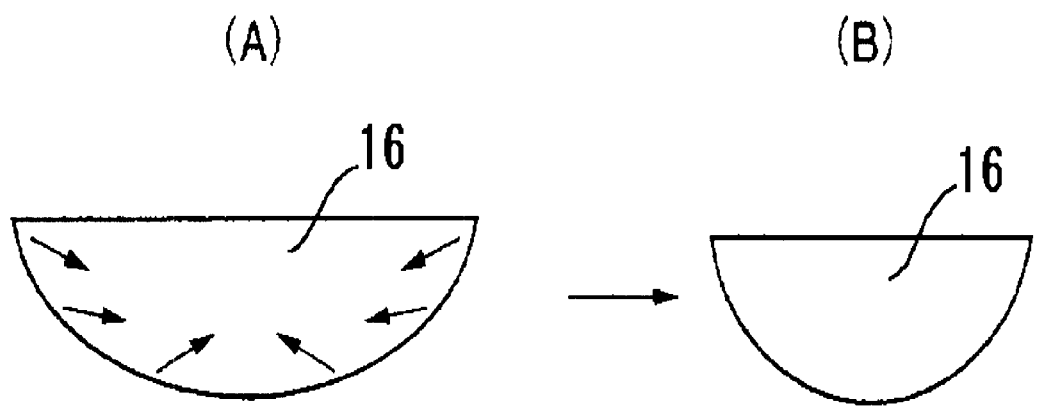
FIG. 4 shows a schematic side view of a mold resin to explain an effect by thermal shrinkage of the mold resin.
Figure 5:
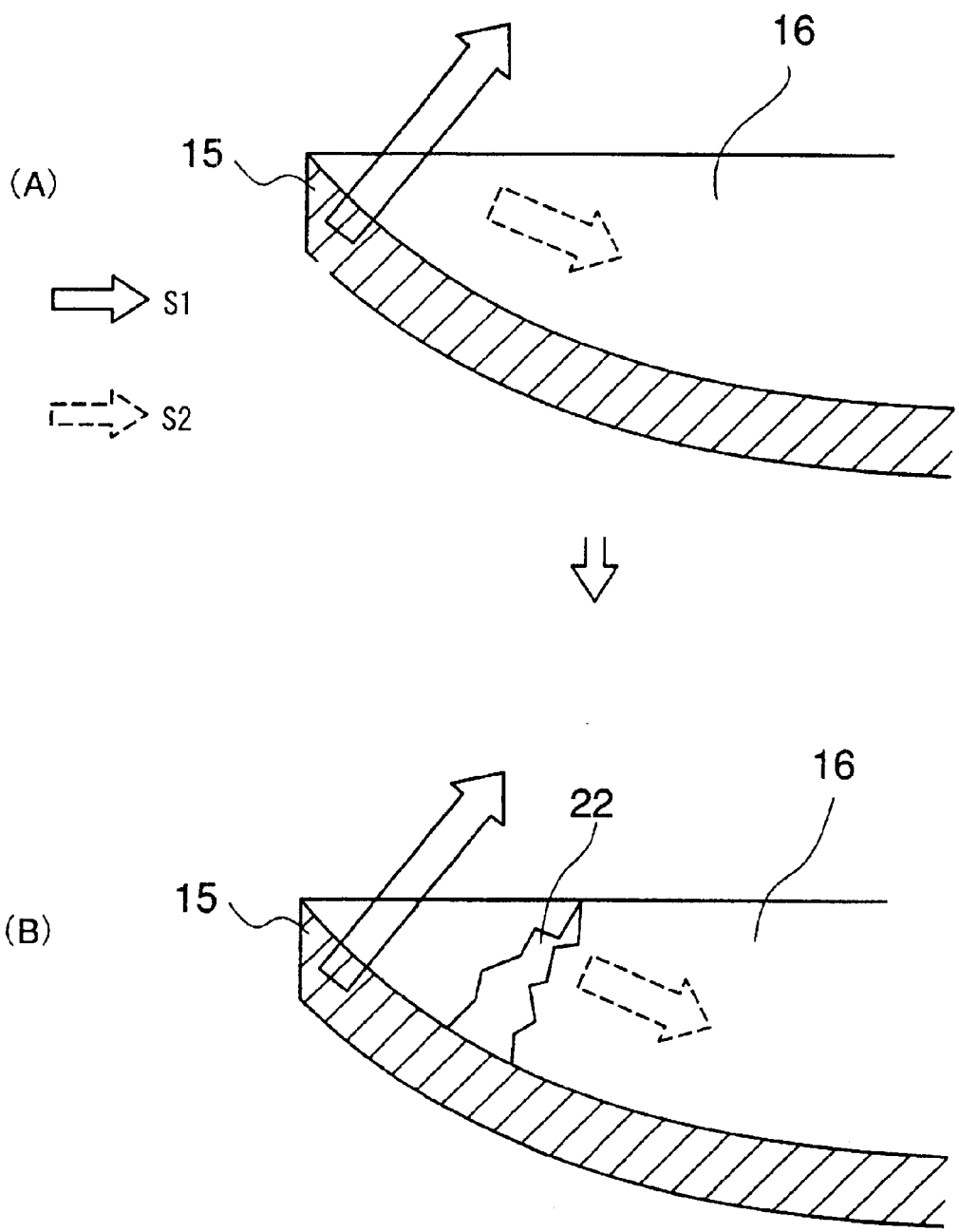
FIG. 5 shows a partial perspective simulation view of a light reflecting member to explain forces applied to a mold resin by the light reflecting member.
Figure 6:
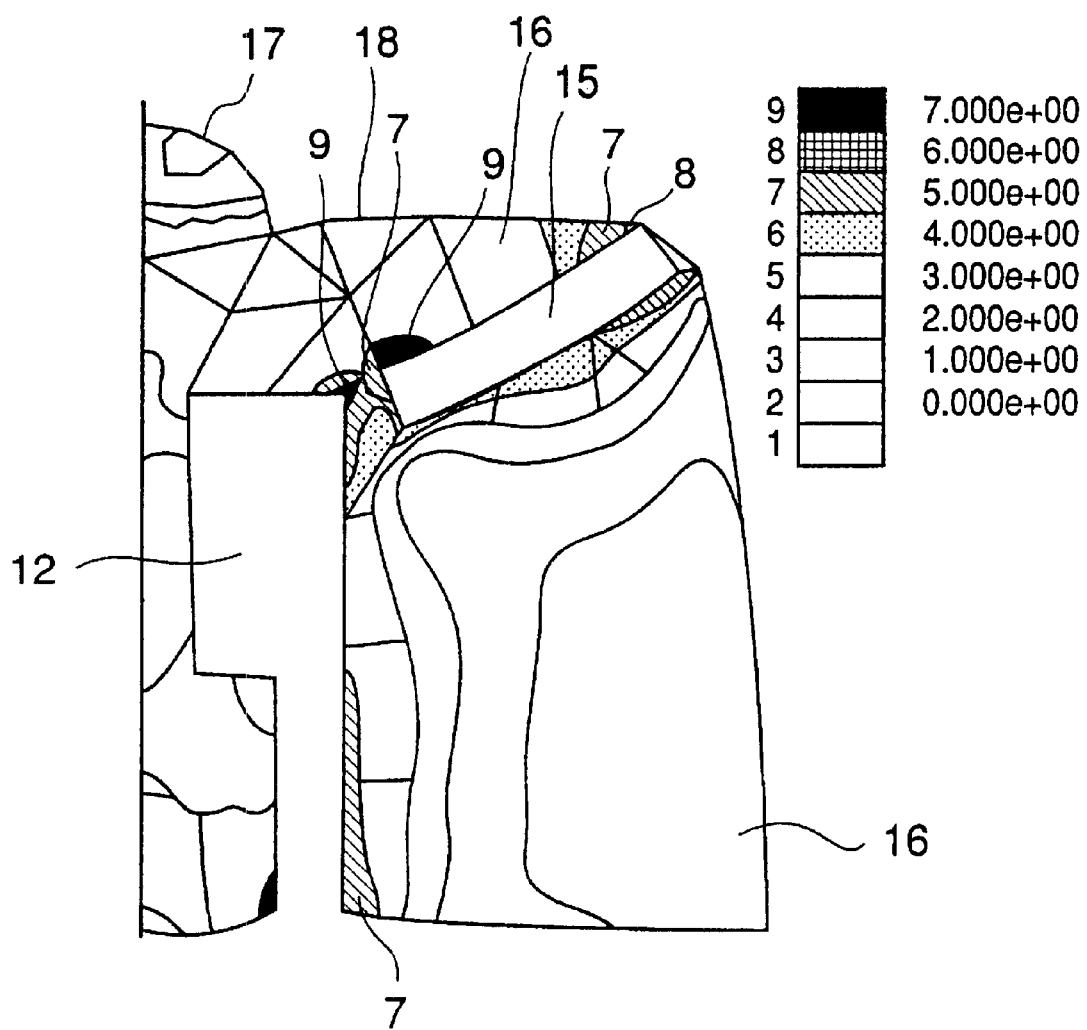
FIG. 6 shows a view of a simulation of forces applied to the resin mold by the light reflecting member.

FIGS. 3 to 6 illustrates possible causes to be generated of this crack. FIG. 3 shows a direction of stress by a temperature change of light reflecting member 15 of FIG. 2. FIG. 4 shows stresses applied to the mold resin 16 on an inner side of light reflecting member 15. FIG. 5 shows stresses and entry of a crack at the thinned portion of mold resin 16 in an edge of light reflecting member 15. FIG. 6 is a simulation diagram of stresses in mold resin 16 near light reflecting member 15.

As a temperature of a metal light reflecting member 15 drops, forces are applied to the member 15 in a direction where the curvature becomes small as shown by arrow marks in FIG. 3 at (A), whereby the member 15 is liable to shrink to a configuration as shown in FIG. 3 at (B). On the other hand, the mold resin 16 at an inner side of light reflecting member 15 shrinks toward the center of gravity of a body made with mold resin 16 as shown by arrow marks in FIG. 4 at (A), and it is liable to shrink to a configuration shown in FIG. 4 at (B). Therefore, in the part that mold resin 16 is thinned at an edge of light reflecting member 15, direction of shrinkage force S1 of light reflecting member 15 is different from the direction of shrinkage force S2 of mold resin 16 as shown in FIG. 5 at (A), whereby a crack 22 is produced as shown in FIG. 5 at (B).

Similar mechanical phenomenon also happens at thinned portions of the mold at the light reflecting member 15 near lead frame 12 or 13. This is shown in simulation of FIG. 6. In FIG. 6 intensities 1 to 9 (larger figure shows larger intensity) of stresses applied to each location of mold resin 16 by lead frame 12 and light reflecting member 15 made of metal are illustrated.

In FIG. 6, strong stresses 7 to 9 are applied to the part corresponding to the portion 20 of mold resin 16 shown in FIG. 2 which is thinned by acute angle part of the most circumference portion of light reflecting member 15, and to the part corresponding to the portion 21 of mold resin 16 shown in FIG. 2 which is thinned near light reflecting member 15 and lead frame 12 or 13, whereby these parts are liable to produce a crack. The part applied by the strongest forces 8 and 9 is located on a concave wall of light reflecting member 15, viz., the light reflection side, and particularly liable to produce a crack.

As such a crack is produced, the light at the crack in its advance direction is bent or gets impossible to be emitted, thereby decreasing the forward light emission. Though light reflecting member 15 and light emitting element chip 11 are sealed with mold resin 16, they are rusted or deteriorated by steam or gas included in the air invaded through the crack to lower the reliability.

Returning to FIG. 1, the light emission device of the first embodiment including a crack prevention structure is advantageous. The structure is made by the bumper members 23a to 23f disposed at portions where forces are concentrated by a difference of thermal expansion coefficients of the light reflecting member 15 and the mold resin 16, and the bumper members are made of materials having a good transmission about light emitted from the light emitting element chip 11 and smaller hardness than that of the mold resin 16.

The bumper members 23a to 23f are desired to be disposed at force concentrated portions on a concave surface, viz. a light reflection side, of the light reflecting member 15 where forces are most concentrated.

By having thus construction, even if the light emission device is used in a place with large temperature change such that a molding resin of high-temperature of around 130° C. is inserted for encapsulation on resin molding and the temperature drops to ordinary temperature and the device is exposed to high temperature like an inside of car in summer, the bumper members can dissipate the stresses produced by the difference of quantity and directions of thermal contraction of light reflecting member 15 and mold resin 16, thereby preventing the mold resin 16 from crack. In addition, the bumper members 23 may rid the light reflecting member 15 near the lead frames 12 and 13 of an edge of acute angle portions, thereby preventing any production of cracks in mold resin 16 by the edge. The bumper members 23 have only to be coated on the portion where stresses are concentrated, thereby simplifying the production process.

The bumper members 23 may employ any materials such as resin, Si, fluorine system coating materials, gas, or liquid as far as its transmittance is good about light emitted by the light emitting chip 11 and its hardness is smaller than that of mold resin 16, and consist of a single layer or multiple layers. When fluorine system coating materials are employed, an air space is produced when the temperature of coat materials drops, providing the advantage that it may be used as it is. An air hollow layer produced by shrinkage of the mold resin 16 also may be used as the bumper member. In addition, about degree of hardness, crack occurs in degree of hardness prescribed with the Japanese Industrial Standard JISK6249 when vulcanized rubber of 80 is employed, but good resultant is obtained when silicone rubber of 39 is employed. Therefore, the hardness of rubber is preferable to be 50 or less, more preferably 40 or less.

In this embodiment, however, when the bumper members are disposed in the force concentrated portion where cracks are liable to occur in the mold resin 16, the index of refraction of bumper members 23 is different from the index of refraction of mold resin 16, thereby bending the emission direction of light only at the bumper members.

Figure 7:
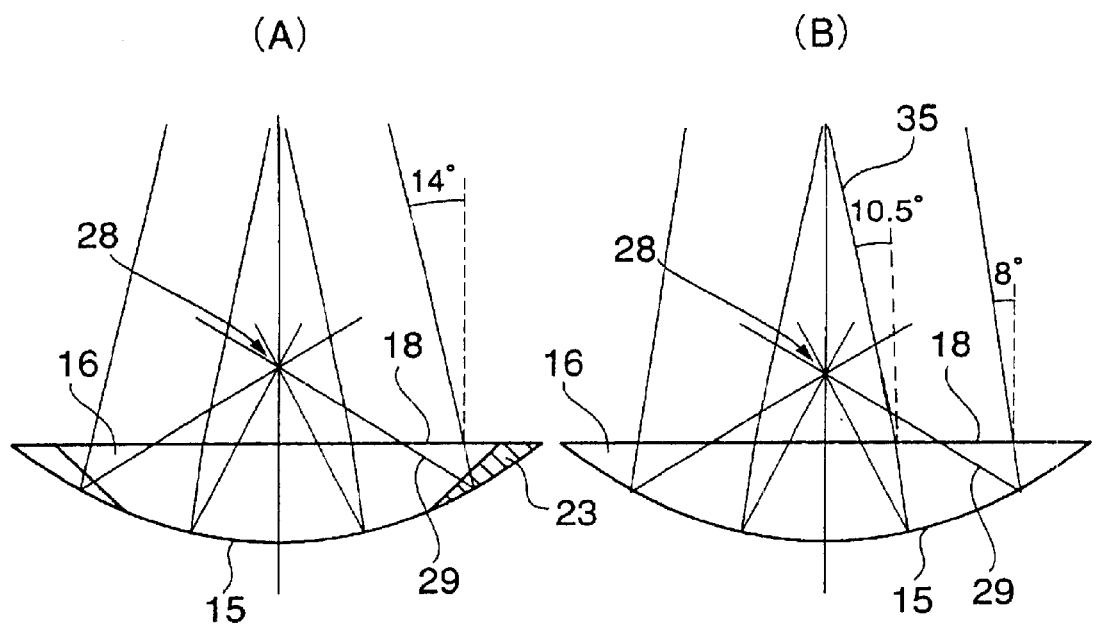
FIG. 7 shows a schematic sectional side view of a light reflecting member at an edge thereof disposed by a bumper member for preventing cracks in a mold resin, and illustrates light paths reflected by the reflection member.

FIG. 7 shows light paths based on experimental values, wherein there are disposed a light reflecting member 15, a mold resin 16, a total reflection region 18, a bumper member 23, and a virtual light emitting element chip 28. FIG. 7 at (A) shows when the bumper member 23 is disposed, and at (B) shows when the bumper member is not disposed. In FIG. 7, the light emitting element chip 11 of FIG. 1 is virtually represented by the virtual light emitting element chip 28 in a symmetric position with total reflection region 18 to simplify the explanation.

In FIG. 7 at (B) where there is no bumper member, the light going to a light path 29 from the virtual light emitting element chip 28 is designed to be reflected by light reflecting member 15 to be emitted from total reflection region 18 with gradient of 8 degrees against the optical axis, and the light going to a light path 35 is designed to be emitted with gradient of 10.5 degrees against the optical axis. In FIG. 7 at (A) where there is disposed the bumper member 23 employing silicon, the light going to the light reflecting member 15 in the same light path 29 is refracted by bumper member 23 to be reflected back with light reflecting member 15, and further refracted when it leaves the bumper member 23. The reflected light is emitted from the total reflection region 18 with gradient of about 14 degrees against the optical axis, whereby it gathers in the optical axis direction. Accordingly, the light passing the bumper member 23 is greatly different from the light reflected by other portion than the member 23 about their emission directions, thereby deteriorating the efficiency of usage about the reflected light from the edge of the light reflecting member 15.

Figure 8:
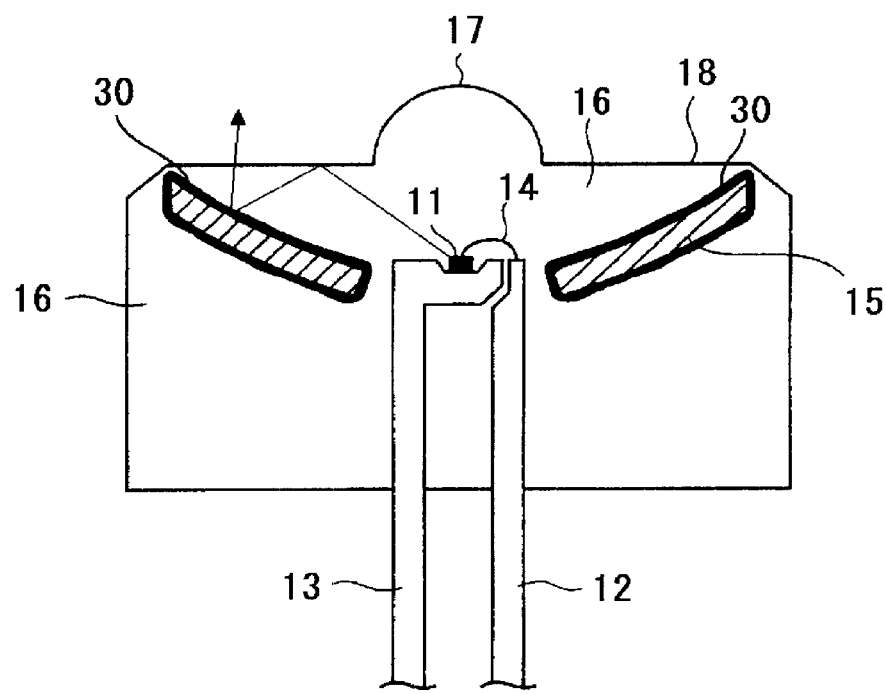
FIG. 8 shows a schematic sectional side view showing a major constitution of a light emission device according to a second embodiment of this invention.

In FIG. 8 there is shown a light emission device according to a second embodiment of this invention, which a pair of bumper members 30 are disposed to cover all surface of a light reflecting member 15 in order to resolve the disadvantages of the first embodiment. The parts corresponding to those in the device of FIG. 1 are given the same reference symbols. The bumper members 30 have a uniform or almost uniform thickness, and are disposed to cover all surface of light reflecting member 15, thereby refracting light with approximately same refraction degrees at the whole reflection surface by bumper members 30, and avoiding the case that a reflection angle at a specified portion is greatly different from others as shown in FIG. 7 at (A).

Figure 9:
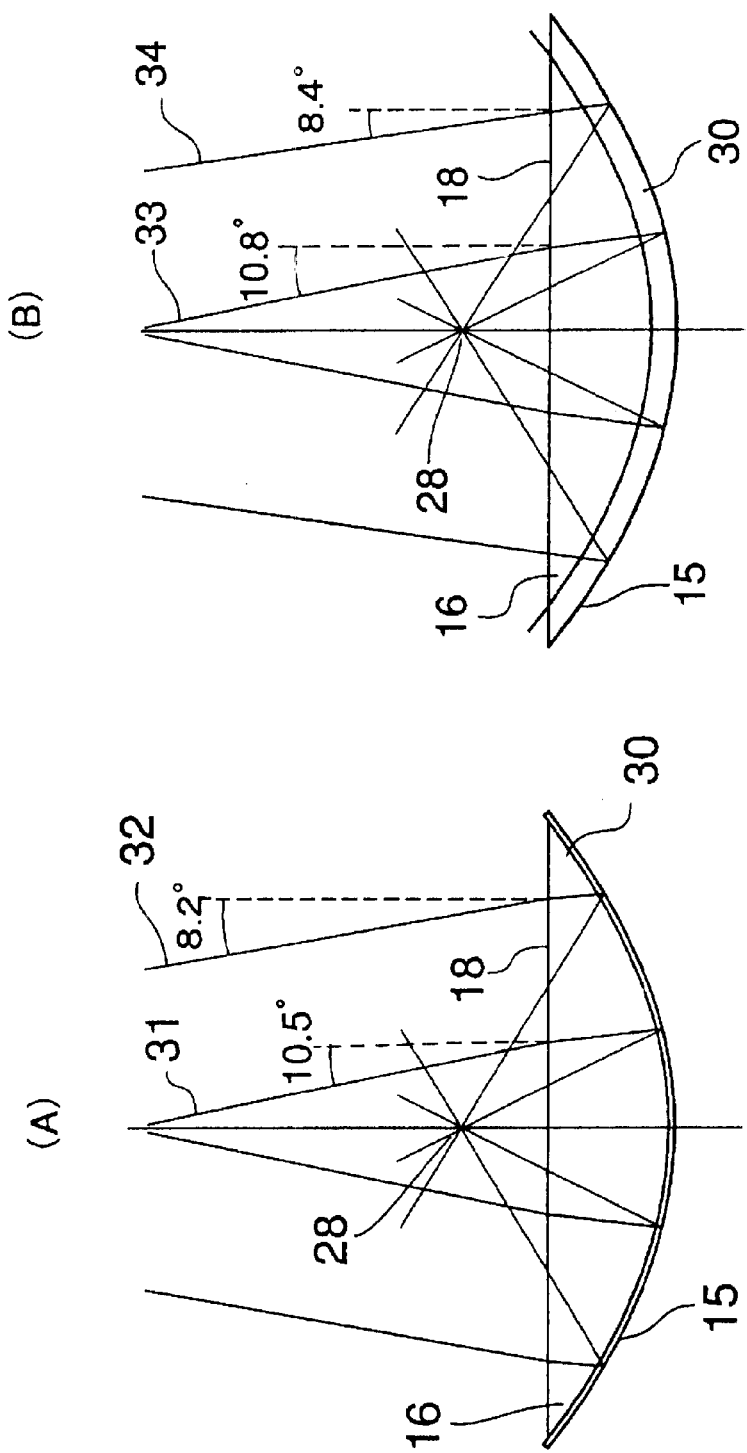
FIG. 9 shows a schematic sectional side view of a light reflecting member having a bumper member disposed over a whole light reflection surface thereof for preventing cracks in a mold resin, and illustrates light paths reflected by the reflection member.

As above-described, the index of refraction of bumper member 30 is different from that of mold resin 16. Accordingly, the incident angles of light to the bumper member 30 is different in the respective locations of the reflection surface thereof even if the bumper member 30 is equally disposed over all reflection surface, thereby causing emission angles of light to differ by the thickness of bumper member 30. FIG. 9 shows the results of examination about emission angles when the thickness of this bumper member 30 is 100 $\mu$m and 300 $\mu$m. A light reflecting member 15 of FIG. 9 is assumed that its curvature is the same as that of the light reflecting member 15 of FIG. 7 at (B), (when there is not bumper member 30, light is emitted from a total reflection region 18 with path, completely the same as that of FIG. 7 at (B)). The light emission device includes mold resin 16, total reflection region 18, virtual light emitting element chip 28 as shown in FIG. 7, and bumper member 30, wherein light passes through light paths 31 to 34.

As silicon 100 microns ($\mu$m) in thickness is uniformly coated on the surface of light reflecting member 15 as shown in FIG. 9 at (A), light emitted from the virtual light emitting element chip 28 is refracted when it enters the bumper member 30 and refracted again when it is reflected back by light reflecting member 15 and appears from bumper member 30 to be emitted from the total reflection region 18. The light directed to the light reflecting member 15 with path 31 in FIG. 9 at (A) similar to the path 35 near the optical axis in FIG. 7 at (B) is emitted from the total reflection region 18 with gradient of 10.5 degrees, the same as FIG. 7 at (B), from optical axis. The light directed to the light reflecting member 15 through the path 32 of FIG. 9 at (A), the same as the path 29 in FIG. 7 at (B), is emitted from the total reflection region 18 with gradient of 8.2 degrees though it is emitted with 8 degrees in FIG. 7 at (B), thereby producing difference of 0.2 degree between both gradients.

When silicon 300 microns ($\mu$m) in thickness is uniformly coated on the surface of light reflecting member 15 as shown in FIG. 9 at (B), the light directed to the light reflecting member 15 through the path 33 of FIG. 9 at (B), similar to the path 35 near the optical axis of FIG. 7 at (B), is emitted from the total reflection region 18 with gradient of 10.8 degrees from the optical axis, thereby producing difference of 0.3 degree from the gradient of path 35. The light directed to the light reflecting member 15 through the path 34 in FIG. 9 at (B), similar to the path 29 of FIG. 7 at (B), is emitted from the total reflection region 18 with gradient of 8.4 degrees from the optical axis, thereby producing difference of 0.4 degree from the gradient of the path 29.

Figure 10:
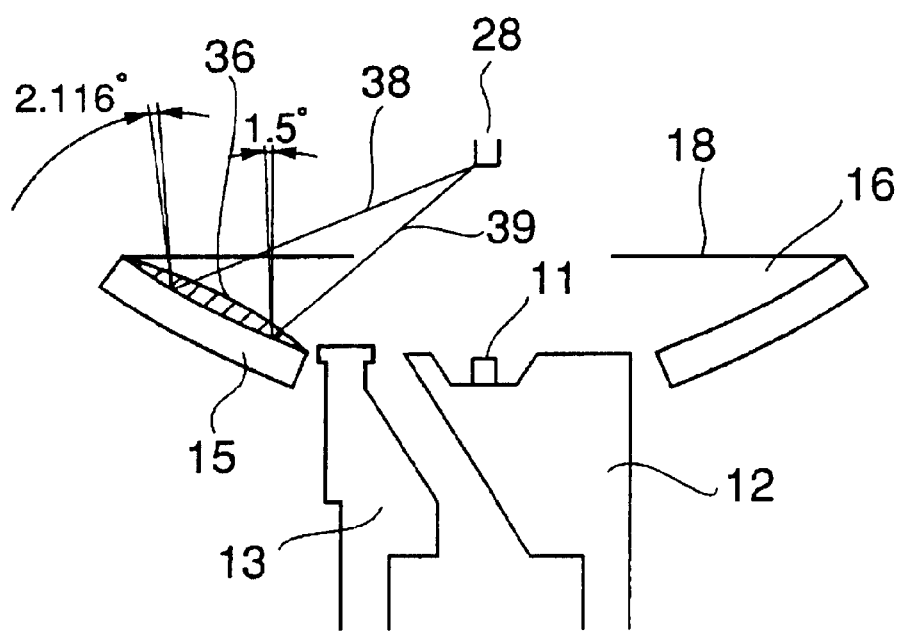
FIG. 10 shows an explanatory view of light paths in a light reflecting member disposed by a bumper member having different thickness at an edge and a center thereof.
Figure 10:
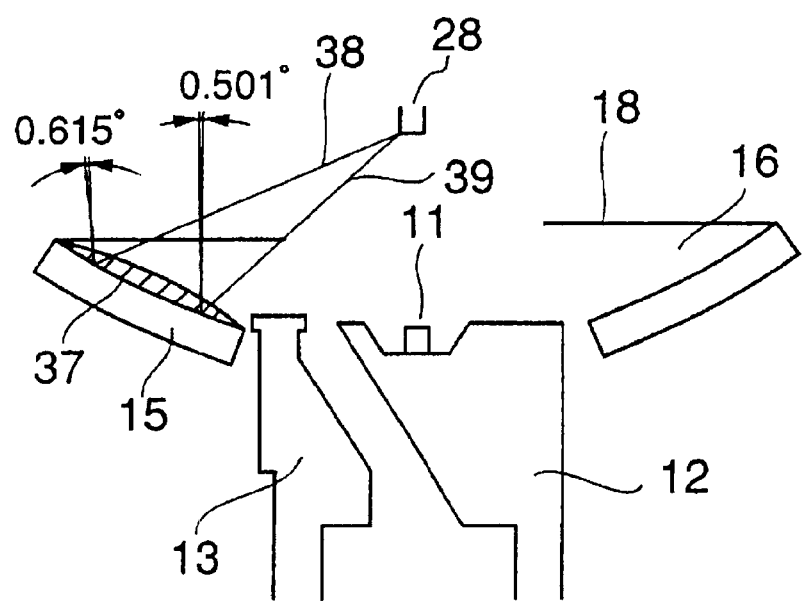

Thus, no large differences in the directions of light emitted from the total reflection region 18 exist when the bumper member 30 is uniformly coated on the light reflecting member 15 even if the thickness of the layer is 100 $\mu$m or 300 $\mu$m. As a practical matter, however, it is difficult to coat silicon over all surface of the light reflecting member 15 in completely uniform thickness. As shown in FIG. 10, bumper members 36 and 37 are generally so coated that they are thick at their central portions and thin at their external and inner edges due to surface tension, wherein the thickness of the bumper members is assumed to be 300 $\mu$m in FIG. 10 at (A) and 100 $\mu$m in FIG. 10 at (B).

When a virtual light emitting element chip 28 is assumed to represent the light emitting element chip 11 to be located in its symmetric position with total reflection region 18 and the thickness of the bumper member is 300 $\mu$m as shown in FIG. 10 at (A), there are produced a gap of about 2.1 degrees in the light path 38 directed to the thinned portion at peripheral of the light reflecting member 15 in comparison with the ejecting direction of the bumper member having the 300 $\mu$m thickness, and a gap of about 1.5 degrees in the light path 39 directed to the inner edge. When the bumper member is 100 $\mu$m in thickness as shown in FIG. 10 at (B), there are produced a gap of about 0.6 degree in the light path 38 directed to the peripheral of the light reflecting member and a gap of about 0.5 degree in the light path 39 directed to the inner edge, thereby lowering both gaps below 1 degree. Accordingly, the thickness of the bumper member is desirable to be 100 $\mu$m or less in order to keep the gaps at 1 degree or less by the bumper member in the light emitting direction.

Figure 11:
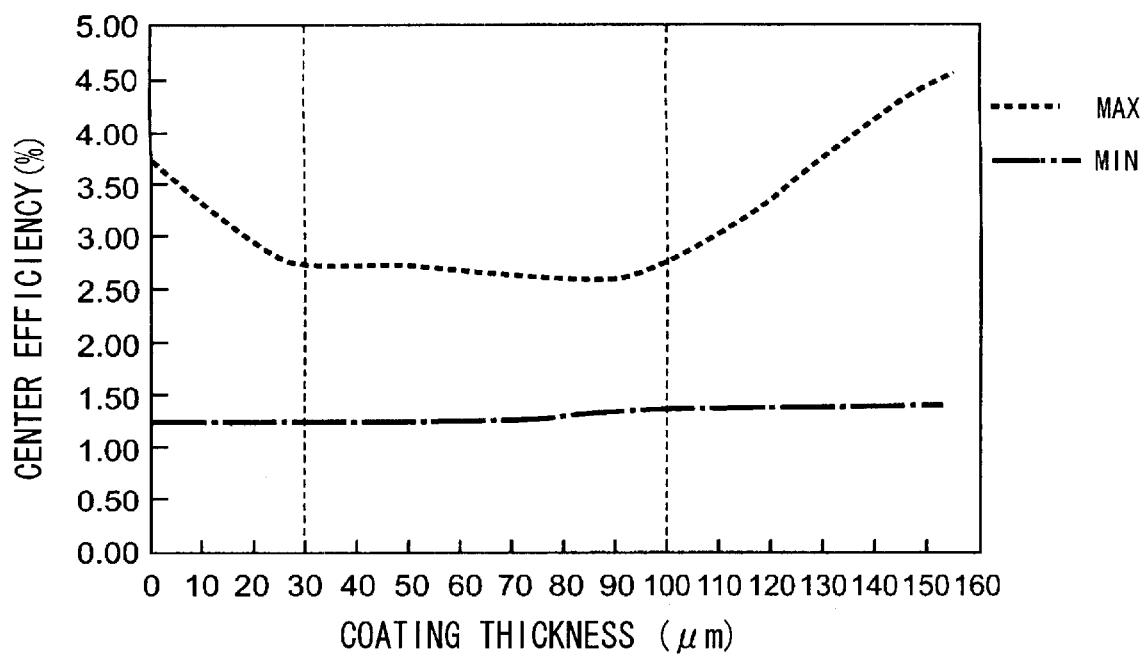
FIG. 11 shows a graph showing a relationship between a thickness of a bumper member for crack prevention and center efficiency of an optical device according to this invention.
Figure 12:
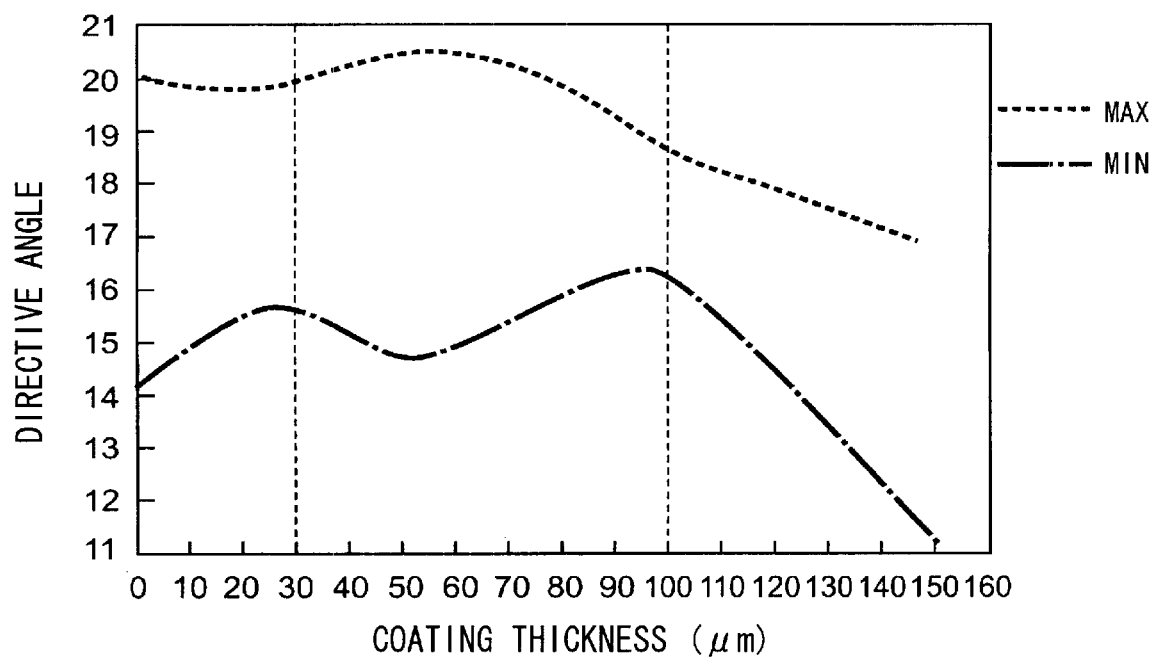
FIG. 12 shows a graph showing a relationship between a thickness of a bumper member for crack prevention and a directive angle of light emitted from a light emitting element according to this invention.

FIGS. 11 and 12 are graphs showing examination results of center efficiency against a thickness of a bumper member (coating thickness), and a spread angle of light emitted from the optical device (directive angle). In FIG. 11, the abscissa represents a thickness of the bumper member (coating thickness), the ordinate represents center efficiency. The center efficiency represents a ratio of quantity of light entering within a circle having a center at the optical axis in a predetermined space apart from the optical device assuming that all quantity of light emitted from the optical device is 100%, and FIG. 11 exemplarily shows a ratio of a quantity of light entering within $\phi$8.4 mm on an irradiation wall in 120 mm spaced-apart from the light emission device. In FIG. 12, the abscissa represents the thickness of the bumper member (coating thickness), the ordinate represents a directive angle. The directive angle represents a spread angle of light beams emitted from the optical device, namely, an angle of irradiated region having a predetermined ratio against the brightest point in an irradiated wall, and FIG. 12 shows an angle of an irradiation region where the predetermined ratio is 50% (half).

MAX and MIN in FIGS. 11 and 12 represent the maximum values and the minimum values of the center efficiencies and the directive angles respectively when component allowance (variation) and assembly allowance are considered in ideal assembly state (design values) by the bumper member having a certain thickness (coating thickness). Accordingly, FIG. 11 shows the maximum value of 2.7% and the minimum value of 1.3% when the thickness of bumper member (coating thickness) is 50 $\mu$m, and the center efficiency is varied within this range.

As shown in FIG. 11, the minimum value MIN of the center efficiency is almost flat when the thickness of the bumper member, namely, the coating thickness is between 0 $\mu$m and 150 $\mu$m. The maximum MAX of the center efficiency is flat when the coat thickness is between 30 $\mu$m and 100 $\mu$m, but higher in other thickness where light gathers at the center, whereby the coating thickness is desired to be designed between 30 $\mu$m and 100 $\mu$m. In FIG. 12, the maximum and minimum values MAX and MIN of the directive angles are within variation of 2 degrees when the thickness of the bumper member (coating thickness) is between 30 $\mu$m and 100 $\mu$, but the minimum value is smaller when the thickness is larger than 100 $\mu$m where light tends to gather in center, whereby the thickness of the bumper member (coating thickness) is desired to be designed between 30 $\mu$m and 100 $\mu$m.

The thickness of the bumper member or coating thickness is predicted to have a fluctuation of 20 $\mu$m with dispersion or environmental conditions in manufacturing, and its strict manufacturing control is difficult. Accordingly, it is desirable to control the fluctuation of the center efficiency and the directive angle to be equal to or less than ±10% even if the coating thickness fluctuates to some extent. In FIGS. 11 and 12, this condition is satisfied by the maximum values and the minimum values when the coating thickness is between 30 $\mu$m and 100 $\mu$m. Thus, there may be provided a bumper member having a little influence to optical characteristics when the coating thickness is between 30 $\mu$m and 100 $\mu$m.

Figure 13:
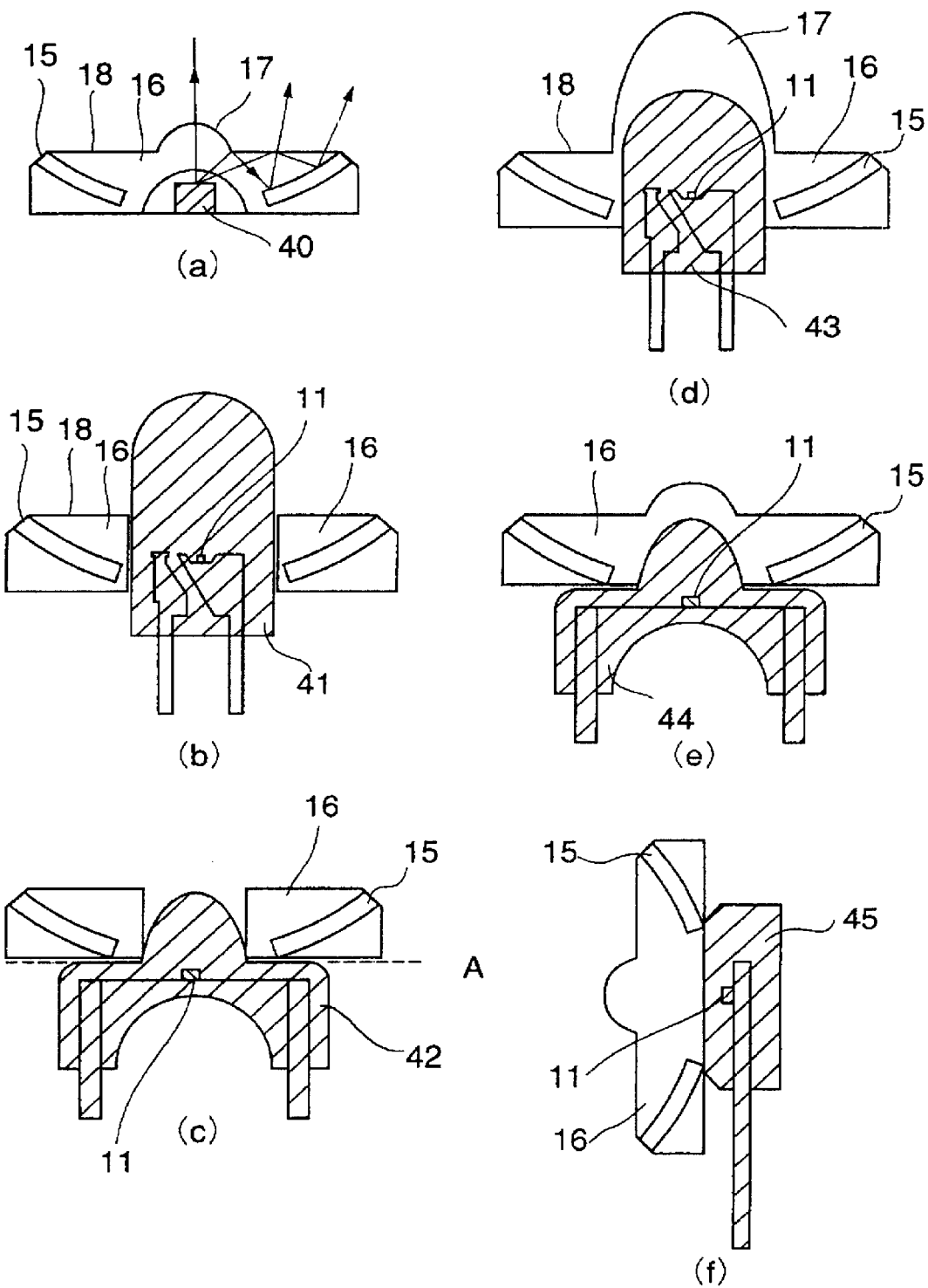
FIG. 13 shows a sectional view of several light emission devices each composed of separated parts of an optical device and a light emitting element according to a third embodiment of this invention.

The foregoing embodiments have described the crack prevention structure of the resin mold of the optical device for the optical element according to this invention, but the optical device may be so modified that the thus constructed optical device having the light reflecting member and the mold resin is coupled with a separate light emitting element module in which a light emitting element is sealed by mold resin without having thus constructed optical device as shown in FIG. 13.

FIG. 13 at (a) to (f) shows as a third embodiment of this invention variations of an optical device including a light reflecting member 15 and a mold resin 16 sealing the reflection member which is coupled with a separate device of a light emitting element module including a light emitting element chip 11, wherein a bumper member is coated on a portion of the resin mold where stresses are concentrated, or a concave wall side or a whole surface of the light reflecting member as described in the foregoing embodiments.

In FIG. 13 at (a), a light emitting element module 40 of a surface mount type is housed within an optical device provided with a light reflecting member 15 and a mold resin 16. As described referring to FIGS. 1 and 8, light from the light emitting element chip 11 is emitted from a direct emission region 17 and a total reflection region 18 which is designed to totally reflect the emitted light to be reflected by the light reflecting member 15 for external emission from the optical device. Thus construction may provide a light emission device having a high efficiency of light use and crack prevention, like an optical device including a light emitting element therein.

FIG. 13 at (b) shows another modification of the optical device including light reflecting member 15 and mold resin 16 for a light emitting element, which has a doughnut configuration having a cannonball-shaped light emitting element module 41 inserted within its central hole. The light toward a total reflection region 18 emitted from light emitting element chip 11 is totally reflected by the region to be forwarded toward the light reflecting member 15 for forward emission from the reflection region.

FIG. 13 at (c) shows still another modification of the optical device including light reflecting member 15 and mold resin 16 for a light emitting element. The optical device has a doughnut configuration inserted by a convex lens portion of a light emitting element module 42 having the lens portion at a forward position of light emitting element chip 11.

FIG. 13 at (d) shows still another modification of the optical device including light reflecting member 15 and mold resin 16. The optical device includes a direct emission region 17 and a rear inner wall that is molded to accommodate a cannonball-shaped light emitting element module 43.

In FIG. 13 at (e), there is shown still another modification, in which the optical device of FIG. 13 at (a) is coupled with a light emitting element module 44 similar to the light emitting element module 42 of FIG. 13 at (c), thereby providing same advantages as those of the device of FIG. 13 at (a). In FIG. 13 at (f), there is shown still another modification, in which an optical device at a rear wall thereof having a planar surface is coupled with a light emitting element module 45 at a front wall thereof having a planar surface, thereby providing same advantages as those of the device of FIG. 13 at (a).

Figure 14:
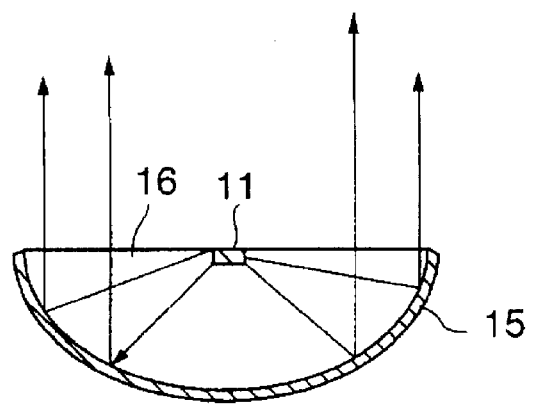
FIG. 14 shows a sectional view of several light emission devices each including a light emitting element disposed on a light emission wall of a mold resin according to a fourth embodiment of this invention.
Figure 14:
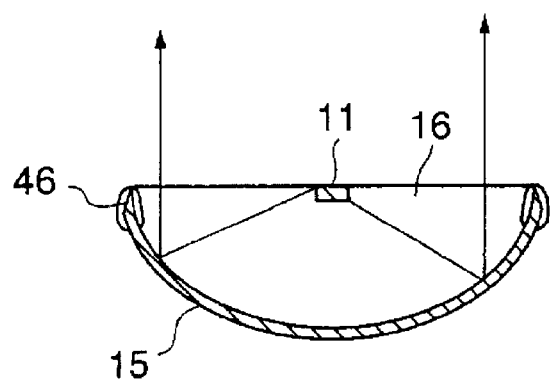
Figure 14:
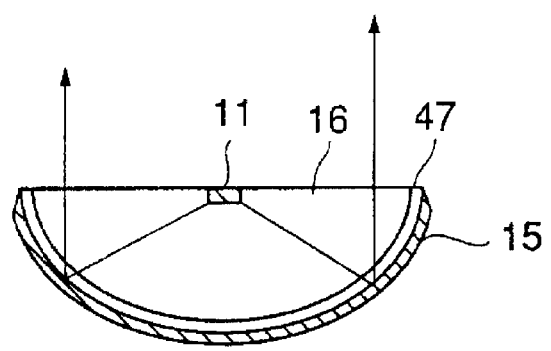

Though the light emitting element chip 11 is located at a side of the light reflecting member 15 in the above-described embodiments, the element chip 11 may be modified to be located at an inner side of a light emission wall of the mold resin 16 as shown in FIG. 14 at (a). In this modification, the light emitting element chip 11 is sealed by the mold resin 16 at a part of a concave wall of the light reflecting member 15, thereby causing a crack in the mold resin 16 at an edge portion of the member 15 as described above.

Such a crack, however, may be avoided by employing a bumper member 46 disposed at an edge portion of the light reflecting member 15 to be sealed by mold resin 16 as shown in FIG. 14 at (b), or a bumper member 47 disposed over entire surface of a concave wall of the light reflecting member 15 as shown in FIG. 14 at (c).

Though the optical device is coupled with the light emitting element comprising a light emitting element chip or a light emitting element module sealing the light emitting element chip by a mold resin in the foregoing embodiments, it may be modified to be coupled with light receiving element composed of a light receiving chip or a light receiving element module sealing the light receiving element chip by a mold resin, such as a photo-diode, a solar battery or the like, instead of the light emitting element as described above, thereby providing a light receiving device (optical apparatus) efficiently receiving light entering through a front wall thereof. This optical apparatus also may employ a coating of bumper materials disposed on a portion of a resin mold where stresses are concentrated or on a concave portion or entire surface of a light reflecting member, thereby preventing the resin mold from any cracks, gathering entire light entering onto the light reflecting member to be applied to the light receiving element, and further preventing the disadvantage such as reduction of reliability by rusting or deteriorating the light reflecting member or the light receiving element by steam and gas.

In the foregoing embodiments, there are described several optical apparatuses such as light emission devices or light receiving devices wherein an optical element of a light emitting element or a light receiving element is disposed or sealed at a predetermined location of an optical device. A method of manufacturing the optical apparatus will be described hereinafter assuming a light emission device wherein a light emitting element chip is sealed at a predetermined location of an optical device.

Figure 15:
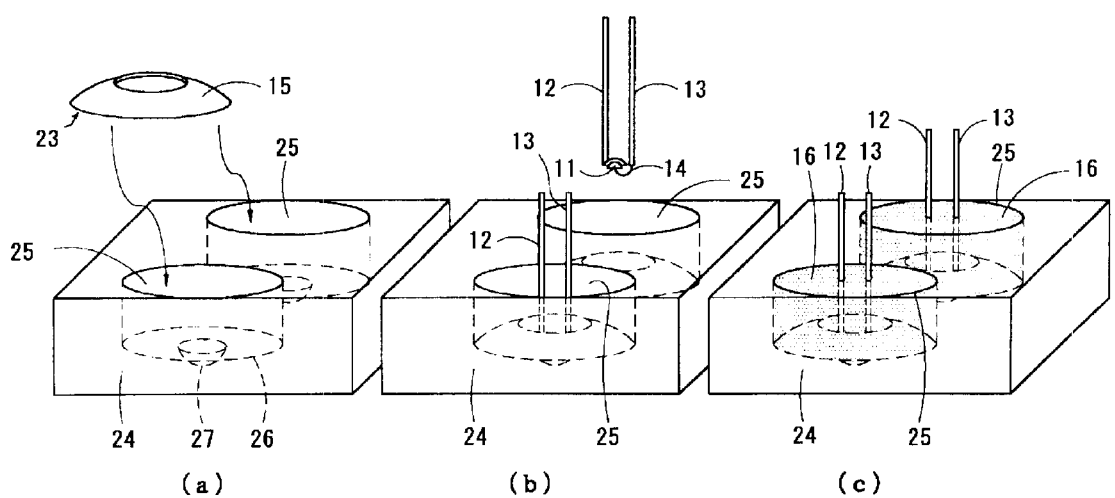
FIG. 15 shows a schematic perspective view of a light emission device according to this invention to explain a manufacturing process of the device.

FIG. 15 at (a) to (c) shows an example of manufacturing a light emission device wherein a light emitting element chip is sealed at a predetermined location of an optical device. A metal mold 24 is provided with a cavity 25 for manufacturing the light emission device, and the cavity 25 at a bottom wall thereof is provided with a pattern face 26 for forming a total reflection region 18 and a pattern face 27 for forming a direct emission region 17.

Prior to manufacturing the light emission device, a light reflecting member 15 in a predetermined location of which a bumper member 23 is disposed is produced. Like the light reflecting member 15 of FIG. 1, a bumper member 23 made of materials having a good transmission about light emitted from the light emitting element chip 11 and smaller hardness than that of the mold resin 16 is disposed on a location of a force concentrated portion of a boundary zone of light reflecting member 15 and mold resin 16.

Next, as shown in FIG. 15 at (a), the light reflecting member 15 provided with the bumper member 23 is inserted within the cavity 25. Since the external diameter of the light reflecting member 15 is almost equal to the inside diameter of the cavity 25, the light reflecting member 15 can be positioned within the cavity 25 by putting the light reflecting member on a bottom wall of the cavity 25.

In FIG. 15 at (b), there is shown a component including a light emitting element chip 11 die bonded on a saucer part of a lead frame 12, and a lead frame 13 connected with the light emitting element chip 11 by a bonding wire 14, which is produced in other process beforehand. As shown in FIG. 15 at (b), the component is put within the cavity 25 with positioning the light emitting element 11 downward, and the lead frames 12 and 13 are supported to fix the light emitting element chip 11 at a predetermined position within the cavity 25.

With this condition, a mold resin 16 is injected within the cavity 25 to insert the light emitting element chip 11 and the light reflecting member 15 within the mold resin to produce a direct emission region (corresponding to region 17 of FIG. 1) and a total reflection region (corresponding to region 18 of FIG. 1) as shown in FIG. 15 at (c). As the injected mold resin 16 is cooled and stiffened, it is taken out from the cavity 25 to produce the light emission device.

According to this manufacturing process, the light emitting element chip 11, the boundary surface of the resin 16, and light reflecting member 15 are easily so positioned that the light directed to the total reflection region 18 in the light emitted from light emitting element chip 11 is totally reflected by the boundary surface of the resin 16, and further reflected by the light reflecting member 15 to be emitted forward from the total reflection region 18 as shown by the light path 19 of FIG. 1, and the bumper member 23 may be easily disposed in a boundary zone of the resin member and the light reflecting member, thereby mass-producing light emission devices each having a high light use efficiency and little occurrence of any crack.

This manufacturing method may be applied to a method for manufacturing an optical device itself by inserting a mold for forming a recess or a flat for accommodating light emitting element modules 40 to 45 of FIG. 13 instead of putting lead frames 12 and 13 mounted by light emitting element chip 11 within the cavity 25 in FIG. 15 at (b).

This manufacturing method also may be modified to manufacture a light receiving device by employing a mold for a light receiving element chip or a light receiving element module instead of the mold for the light emitting element chip 11 or the light emitting element modules 40 to 45.

The optical device for an optical element and the optical apparatus employing the optical device in the foregoing embodiments are useful for an optical apparatus, such as a display device, a light source for car installation, or an outdoor display instrument, which is exposed in a bad environment of installation such as outdoors having intense difference of heat and cold or inside of an automobile where considerably high temperatures occur in summer. Several applications of the optical device will be described hereinafter in conjunction with FIGS. 16 to 25.

Figure 16:
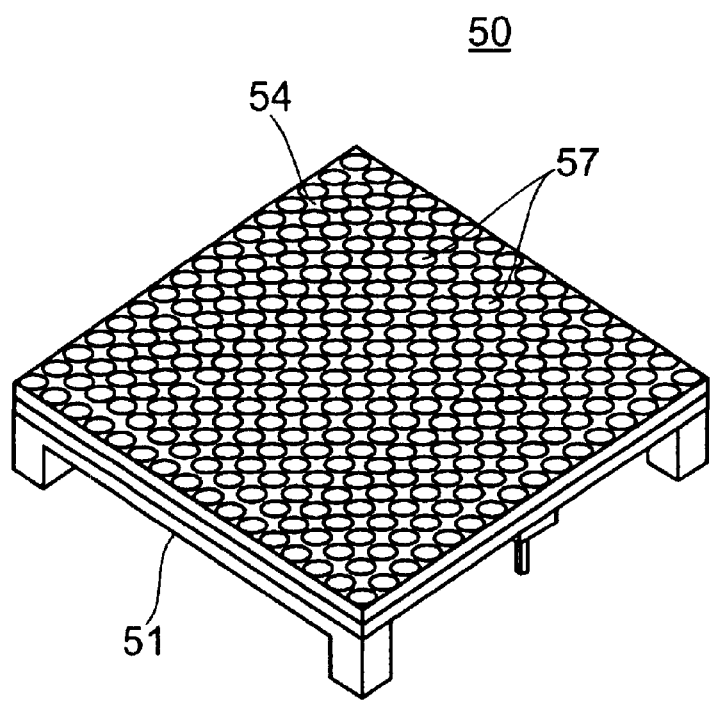
FIG. 16 shows a perspective view of a light emission device array employing a plurality of optical devices arrayed in the device according to this invention.
Figure 17:
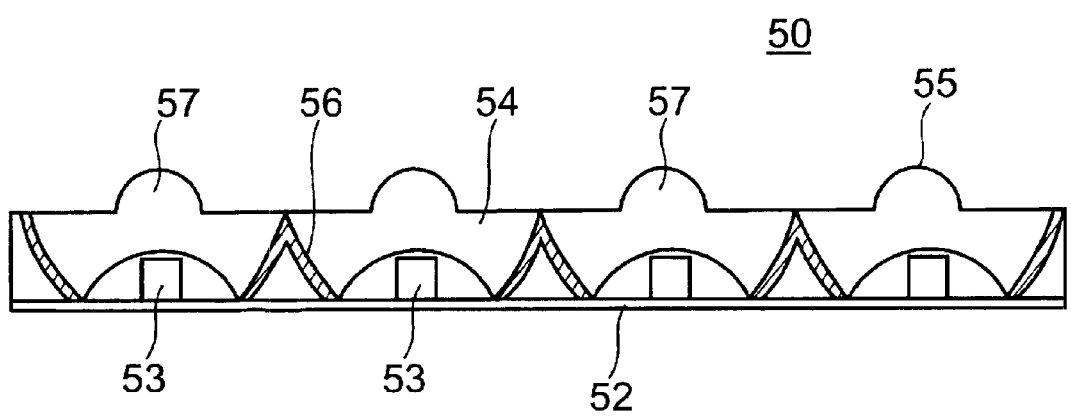
FIG. 17 shows a schematic sectional side view of the light emission device array of FIG. 16.

FIG. 16 is a perspective view of a light emission device array 50 (optical apparatus) including an optical device array 54 having a plurality of optical devices, such as the optical device shown in FIG. 13 at (a), disposed in an array fashion, and FIG. 17 is a sectional side view of the array 50. A plurality of light emitting elements 53 composed of a plurality of light emitting element chips or a plurality of light emitting element modules sealing the light emitting element chips by resins are arranged at predetermined intervals on a circuit board 52 disposed on a pedestal base 51, and the optical device array 54 is put on the light emitting elements 53 to provide a plurality of light emission devices 57. In the optical device array 54 there are disposed direct emission regions 55 and light reflecting members 56 at the same intervals as those of the light emitting elements 53. The respective light emission devices 57 arranged at the predetermined intervals in the light emission device array 50 are designed to be individually energized for displaying various patterns. The optical device in FIGS. 16 and 17 employing the optical device of FIG. 13 at (a) may be modified to employ any one of light emission devices shown in FIG. 13 at (b) to (f) and FIGS. 1, 8 and 14.

Figure 18:
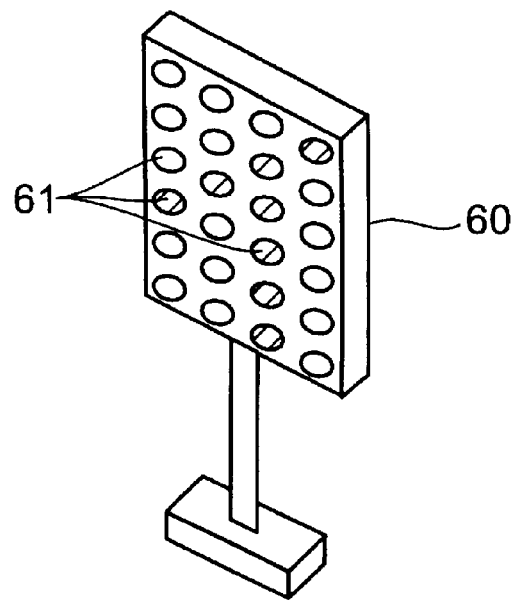
FIG. 18 shows a perspective view of a display apparatus employing a plurality of optical devices according to this invention.

FIG. 18 shows a perspective view of a display device 60 as an optical apparatus employing a plurality of light emission devices 61 each including an optical device and a light emitting element composed of a light emitting element chip or module according to this invention. In the display device 60, a plurality of light emission devices 61 are arranged in a matrix or honeycomb fashion and each light emission device 61 is designed to individually flashed to display various patterns. The display device 60 of FIG. 18 employs a stand, but may be modified to be hanged on an inner wall or an outer wall of a housing or building.

Figure 19:
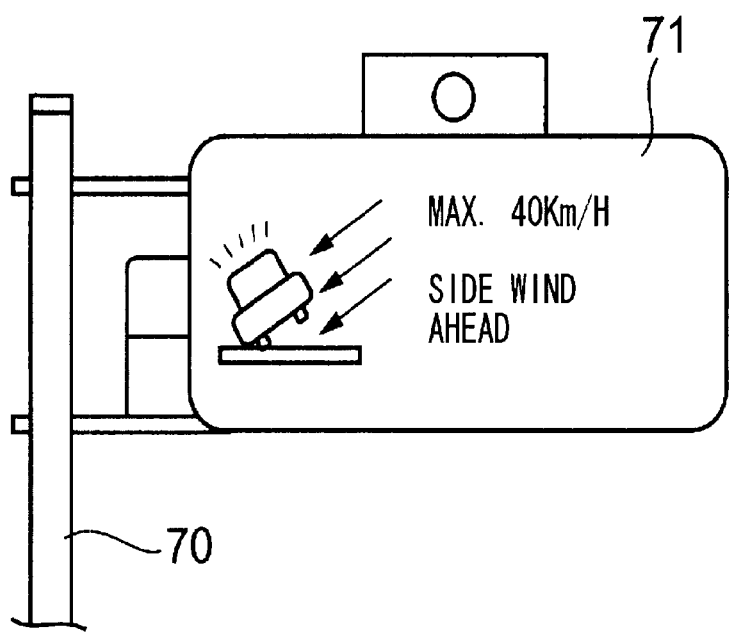
FIG. 19 shows a front elevation view of a light emission display unit supported by a pole and employing a plurality of optical devices according to this invention.
Figure 20:
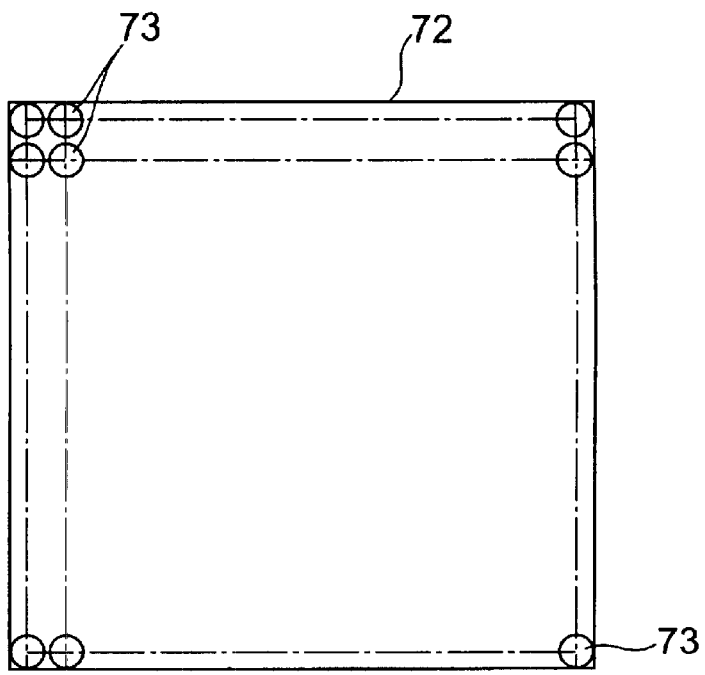
FIG. 20 shows a front elevation view of the light emission display unit of FIG. 19.
Figure 21:
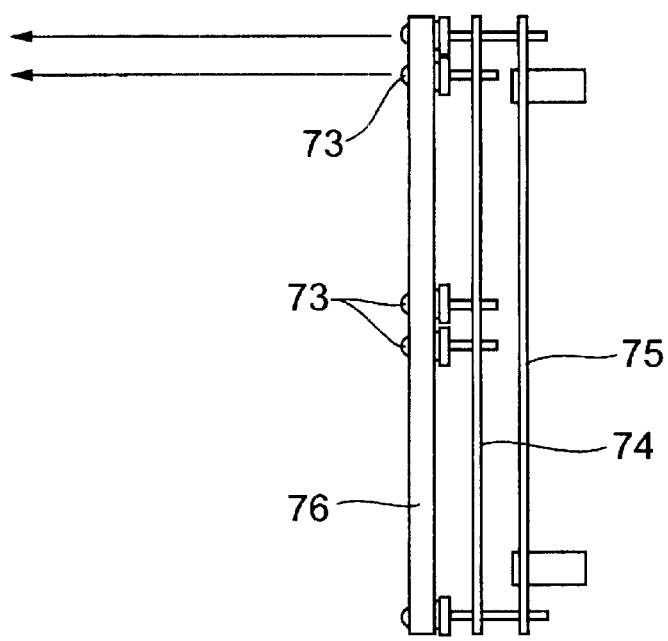
FIG. 21 shows a side view of the light emission display unit of FIG. 19.

FIG. 19 is a front view of a light emission display apparatus 71 including a plurality of light emission devices each comprising an optical device for a light emitting element and a light emitting element including a light emitting element chip or module according to this invention, which is supported by a pole 70. FIG. 20 shows a light emission display unit 72 providing the display apparatus 71, and FIG. 21 shows a side view of the display unit 72. The light emission display apparatus 71 comprises light emission devices 73 for displaying characters or illustration to inform drivers of traffic road conditions or weather reports. As shown in FIG. 21, the light emission devices 73 are mounted on a substrate 74 which is put between a base plate 75 and a cover plate 76, and each light emission device 73 is exposed through a hole of the cover plate 76. The light emission devices 73 are disposed on the substrate 74 in a suitable pattern so as to emit suitable color light in accordance with marks or characters to be displayed.

Figure 22:
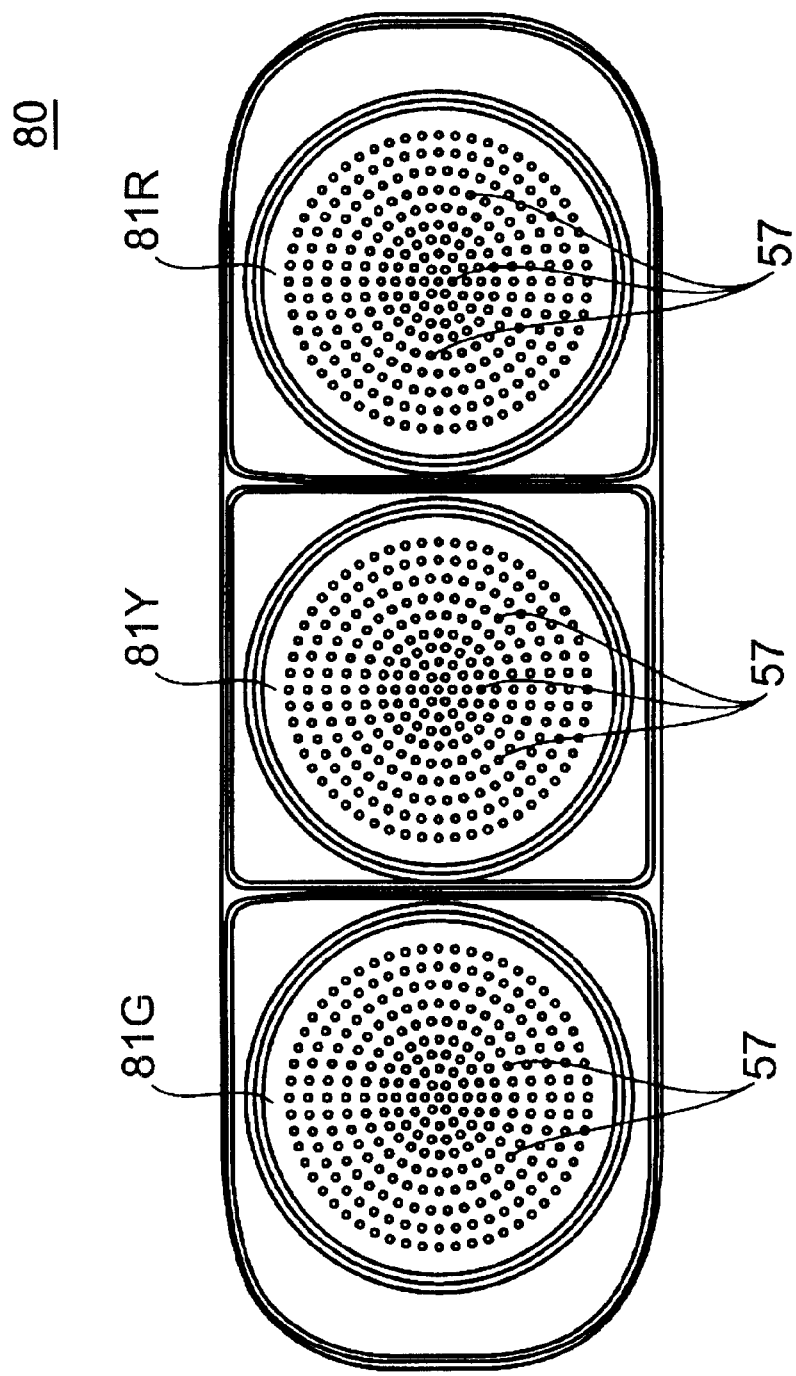
FIG. 22 shows a front elevation view of a traffic signal employing a plurality of optical devices according to this invention.
Figure 23:
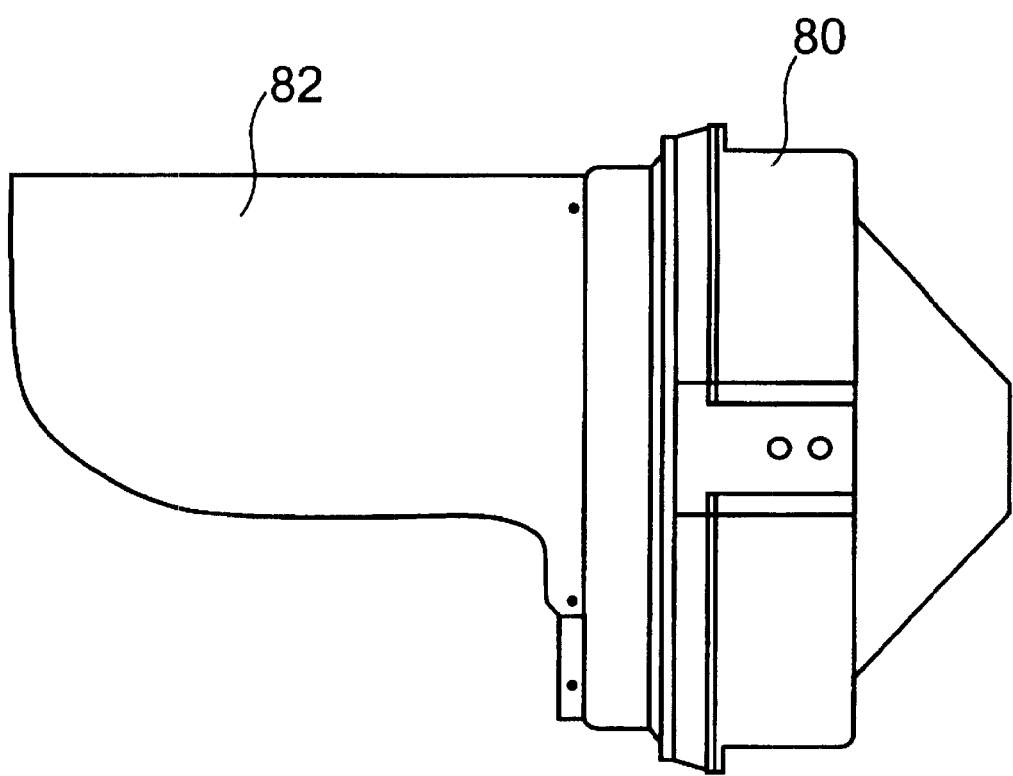
FIG. 23 shows a side view of the traffic signal of FIG. 22.

FIG. 22 shows a front view of a signal 80 as an optical apparatus including a plurality of light emission devices 57 each having an optical device and a light emitting element comprising a light emitting element chip or module according to this invention. The signal 80 is provided with signal lamps 81R, 81Y and 81G for red, yellow and green colors. FIG. 23 shows a side view of the signal 80 at an upper portion thereof including a hood covering the signal lamps. As shown in FIG. 17, in each of the signal lamps 81R, 81Y and 81G, many light emission devices 57 of the corresponding light emission color are mounted on a substrate 52 to be housed within a casing a front of which is covered with a milk-white or a semitransparent cover.

Figure 24:
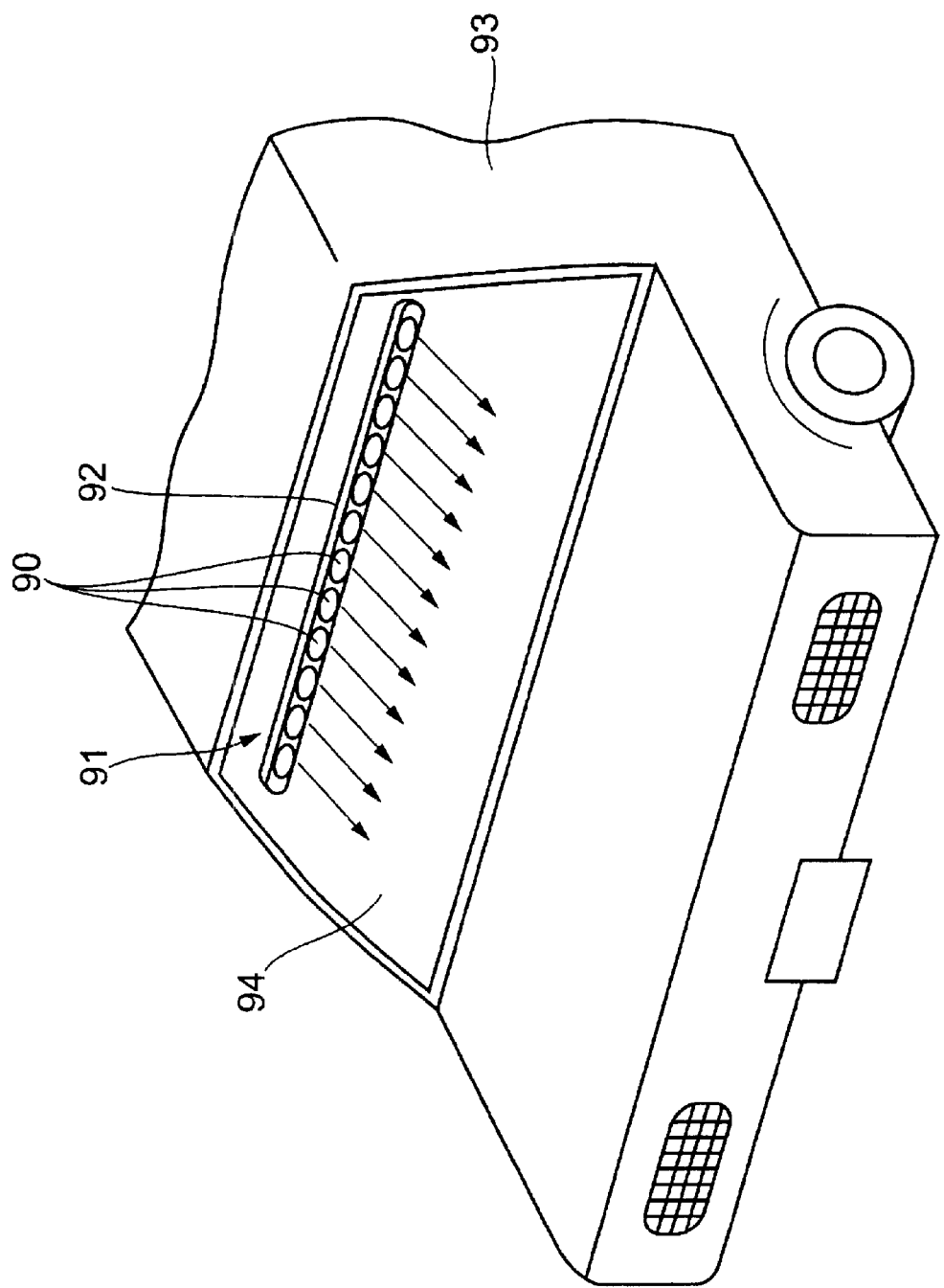
FIG. 24 shows a schematic view of a high mount stop lamp installed in a rear of an automobile, which employs the optical devices according to this invention.
Figure 25:
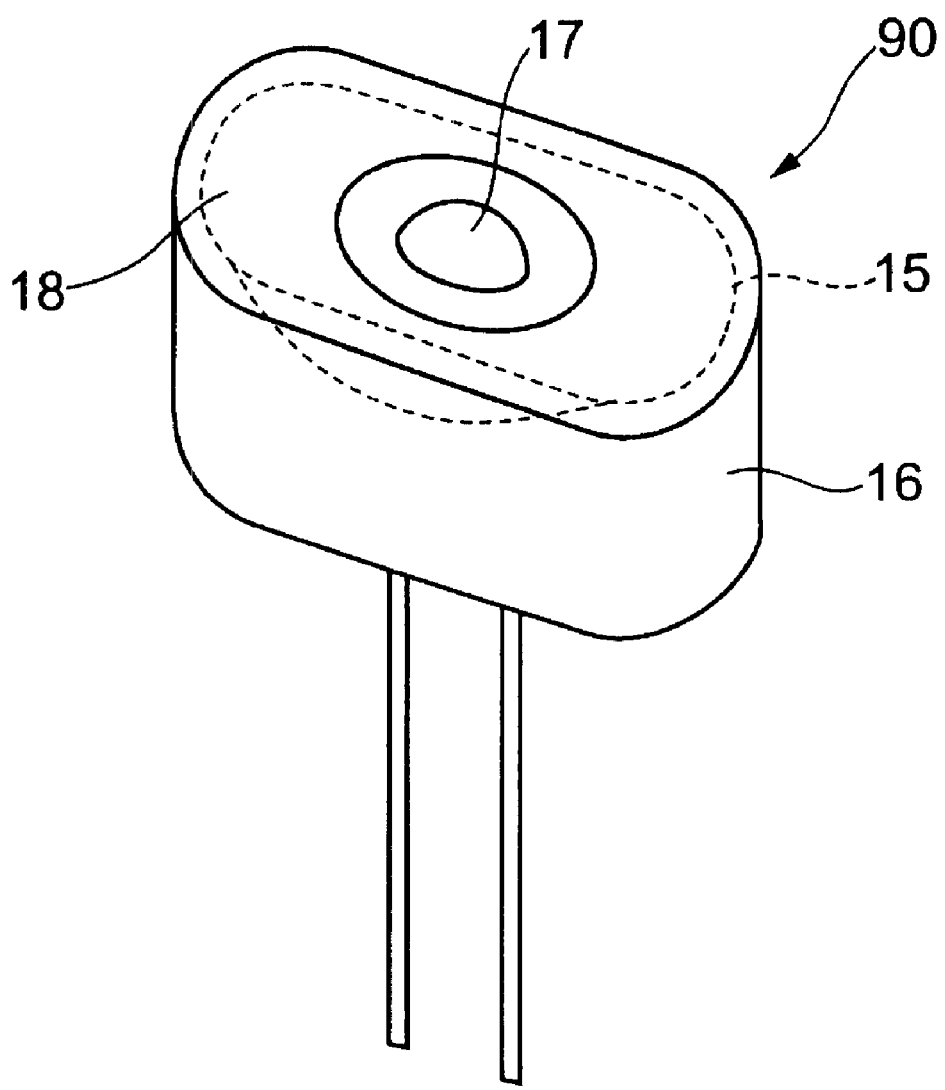
FIG. 25 shows a perspective view of a light emission device employed in the high mount stop lamp of FIG. 24.
Figure 26:
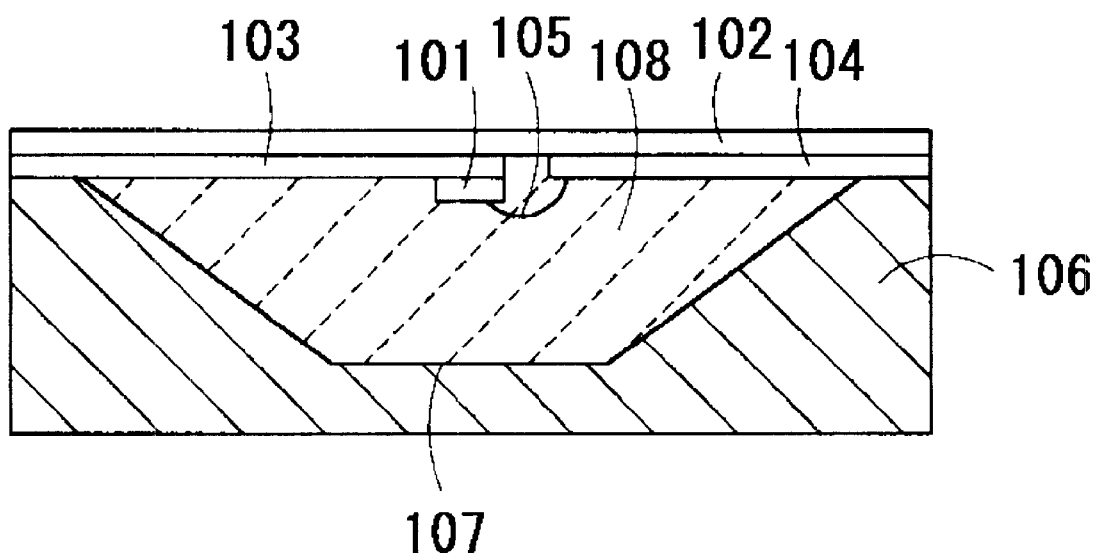
FIG. 26 shows a schematic sectional side view of a conventional light emitting apparatus.

FIG. 24 is a perspective view of a high mount stop lamp 91 employing a plurality of light emission devices 90 of about ellipse type as shown in FIG. 25 which are aligned in a line on a long sideways substrate 92. The light emission device 90 includes an optical device and a light emitting element comprising of a light emitting element chip or module according to this invention.

The light emission device 90 for the high mount stop lamp has a same construction as that of the light emission device of FIGS. 1, 8, 13 or 14, but a disc-shaped light reflecting member 15 is inserted within a mold resin 16 by downwardly bending both ends of the member 15 because the whole configuration of the device 90 has a front wall long sideways such as ellipse, oval or rectangle. The devices 90 are mounted on the substrate 92 so that the major axis directions of the devices are parallel with a length direction of the substrate.

The high mount stop lamp 91 is installed in an inside of a rear window 94 of a vehicle 93. When a driver of the vehicle 93 steps on a brake pedal, all light emission devices 90 illuminates at once to alarm its following vehicle. When the high mount stop lamp 91 employs such light emission devices 90 long sideways, oblong light is emitted with good efficiency. In addition, the number of necessary light emission devices 90 may be reduced by making each light emission device 90 oblong, thereby reducing the manufacturing cost of the high mount stop lamp 91.

Thus, according to this invention, any stress produced by a difference of thermal expansion coefficients of a light reflecting member and a resin mold is absorbed by a bumper member to avoid production of any cracks, thereby preventing any production of a region where light cannot be emitted forwardly by a crack, and further preventing such a disadvantage such as reduction of reliability by rusting or deteriorating the light reflecting member or the light receiving element by steam or gas. Accordingly, there may be provided an optical device for a light element useful for a display device exposed in a bad environment of installation such as outdoors having intense difference of heat and cold or inside of an automobile where it is considerably high temperature in summer.

This bumper member is designed to have a uniform or uniform likely thickness equal to 100 $\mu$m or less, thereby minimizing the deviation of directions of light by difference of indexes of refraction of the bumper member and the resin mold and optimizing the center efficiency and the directive angle to provide an optical device having good efficiency about its assembling which can resolve variations appearing on assembling.

The dimensions, materials, configurations, the relative arrangements of components described in the foregoing embodiments are only simple demonstrative examples rather than a purpose to limit the field of this invention as far as not particularly specified. Accordingly, while in the foregoing specification this invention has been described in relation to certain preferred embodiments thereof, and many details have been set forth for purpose of illustration, it will be apparent to those skilled in the art that the invention is susceptible to additional embodiments and that certain of the details described can be varied considerably without departing from the scope of the present invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An optical device for an optical element to control a light path about emission light emitted from the optical element to external or incident light entered from external to the optical element, comprising:
   a light reflecting member,
   a resin member covering a light reflection surface of said light reflecting member, and
   a bumper member interposed between said light reflecting member and said resin member,
   said resin member including a boundary surface for almost totally reflecting light deviated from a predetermined region in front of said optical element, said boundary surface of the resin member or said light reflecting member being disposed such that light deviating from said predetermined region in front of said optical element and passing between said optical element and an external of said optical device is reflected more than once with each of said boundary surface and said light reflecting member.

2. An optical device according to claim 1, in which said resin member further includes a lens portion for emitting or collecting light reaching said predetermined region in front of said optical member.

3. An optical device according to claim 1, in which said bumper member is disposed on a concentrated portion of stresses produced by the thermal expansion or shrinkage of said light reflecting member and said resin member.

4. An optical device according to claim 1, in which said bumper member is disposed at least on a light reflection surface of said light reflecting member.

5. An optical device according to claim 1, in which said bumper member comprises a soft layer having low degree hardness, a gas layer, a fluid layer or a cavity layer produced by shrinkage.

6. An optical device according to claim 1, in which said bumper member has hardness of 50 or less as measured with JISK6249.

7. An optical device according to claim 1, in which said bumper member is configured to have a substantially uniform thickness.

8. An optical device according to claim 1, in which said bumper member has a thickness of 100 $\mu$m or less.

9. An optical device according to claim 1, in which said bumper member has a thickness in a range of 30 $\mu$m to 100 $\mu$m.

10. An optical device array comprising a plurality of optical devices in the array,
    wherein each of the plurality of optical devices for an optical element comprise:
    a light reflecting member,
    a resin member covering a light reflection surface of said light reflecting member, and
    a bumper member interposed between said light reflecting member and said resin member,
    said resin member including a boundary surface for reflecting light deviated from a predetermined region in front of said optical element, said boundary surface of the resin member or said light reflecting member being disposed such that light deviating from said predetermined region in front of said optical element and passing between said optical element and an external of said optical device is reflected more than once with each of said boundary surface and said light reflecting member disposed.

11. An optical apparatus comprising:
    An optical device array comprising a plurality of optical devices, each of the plurality of optical devices for an optical element comprise:
    a light reflecting member,
    a resin member covering a light reflection surface of said light reflecting member, and
    a bumper member interposed between said light reflecting member and said resin member,
    said resin member including a boundary surface for reflecting light deviated from a predetermined region in front of said optical element, said boundary surface of the resin member or said light reflecting member being disposed such that light deviating from said predetermined region in front of said optical element and passing between said optical element and an external of said optical device is reflected more than once with each of said boundary surface and said light reflecting member disposed in which said optical elements are so disposed that light deviating from said predetermined region in front of each of said optical elements and passing between each of said optical element and an external of each of said optical devices is reflected more than once with each of said boundary surface and said light reflecting member.

12. An optical apparatus comprising an optical element and an optical device for the optical element to control a light path about emission light emitted from the optical element to an external or incident light entered from an external to the optical element, said optical device comprising:

a light reflecting member, a resin member covering a light reflection surface of said light reflecting member, and a bumper member interposed between said light reflecting member and said resin member, said resin member including a boundary surface for almost totally reflecting light deviated from a predetermined region in front of said optical element, said boundary surface of the resin member or said light reflecting member being so disposed that light deviating from said predetermined region in front of said optical element and passing between said optical element and an external of said optical device is reflected more than once with each of said boundary surface and said light reflecting member.

13. An optical apparatus according to claim 12, in which said optical element comprises a light emitting element composed of a light emitting element chip or a light emitting element module in which said light emitting element chip is sealed by a mold resin.

14. An optical apparatus according to claim 13, in which said boundary surface of the resin member includes a region where a total reflection point of said boundary surface for totally reflecting first light emitted from said light emitting element has the same location as that of a passing point of said boundary surface passed by second light which is emitted from said light emitting element and totally reflected on a point of said boundary surface closer to said light emitting element than said total reflection point to be reflected by said light reflecting member for emission to an external of the apparatus.

15. An optical apparatus according to claim 12, in which said optical element is a light receiving element which is a light receiving element chip or a light receiving element module in which the light receiving element chip is sealed by a mold resin.

16. An optical apparatus according to claim 15, including a first light path where first external light entering through said boundary surface of the resin member to be reflected by said light reflecting member is totally reflected on a total reflection point of said boundary surface to enter into said light receiving element, and a second light path where second external light entering through said total reflection point of the boundary surface to be reflected by said light reflecting member is totally reflected on a point of said boundary surface closer to said light receiving element than said total reflection point to enter into said light receiving element.

17. An optical apparatus according to claim 12, in which said optical element is disposed near a mirror image position of a focal point of said light reflecting member over said boundary surface of the resin member.

18. A method for manufacturing an optical device for an optical element to control a light path about emission light emitted from the optical element to an external or incident light entered from an external to the optical element, the method comprising:

putting a bumper member on a light reflecting member, and covering said light reflection with a resin member so that light deviating from a predetermined region in front of said optical element and passing between said optical element and an external of said optical device is reflected more than once with each of said boundary surface and said light reflecting member.

19. A method for manufacturing an optical apparatus including an optical element within the apparatus to control a light path about emission light emitted from the optical element to an external or incident light entered from an external to the optical element, the method comprising:

putting a bumper member on a light reflecting member, and covering said optical element and said light reflecting member with a resin member so that light deviating from a predetermined region in front of said optical element and passing between said optical element and an external of said optical apparatus is reflected more than once with each of said boundary surface and said light reflecting member.

20. A method for controlling a light path about emission light emitted from an optical element to an external or incident light entered from an external to the optical element in an optical apparatus including a light reflecting member and a resin member covering the light reflecting member provided with a boundary surface, the method comprising:

directing light deviating from a predetermined region in front of said optical element and passing between said optical element and an external of said optical apparatus so as to be reflected more than once with each of said boundary surface and a light reflecting member, and directing light reflected by said light reflecting member to pass through a bumper member disposed on at least a portion of said light reflecting member.

21. An optical apparatus including a plurality of light emitting elements composed of light emitting element chips or light emitting element modules in which said light emitting element chips are sealed by mold resins, and a plurality of optical devices controlling light paths about emission light emitted from said light emitting elements to externals, said optical devices each comprising a light reflecting member, a resin member covering a light reflection surface of said light reflecting member, and a bumper member interposed between said light reflecting member and said resin member, said resin member including a boundary surface for almost totally reflecting light deviated from a predetermined region in front of said light emitting element, said boundary surface of the resin member or said light reflecting member being so disposed that light deviating from said predetermined region in front of said light emitting element and passing from said light emitting element to an external of said optical device is reflected more than once with each of said boundary surface and said light reflecting member.

* * * * *